(12) United States Patent
Kawagoe et al.

(10) Patent No.: US 6,368,905 B1
(45) Date of Patent: *Apr. 9, 2002

(54) PROCESS FOR MANUFACTURING A SEMICONDUCTOR WAFER, A SEMICONDUCTOR WAFER, PROCESS FOR MANUFACTURING A SEMICONDUCTOR INTEGRATED CIRCUIT DEVICE, AND SEMICONDUCTOR INTEGRATED CIRCUIT DEVICE

(75) Inventors: Hiroto Kawagoe, Hinode-machi; Tatsumi Shirasu, Kawasaki; Shogo Kiyota, Tateno-machi; Norio Suzuki, Higashimurayama; Eiichi Yamada, Yamaguchi; Yuji Sugino, Yamanashi; Manabu Kitano, Yanai; Yoshihiko Sakurai; Takashi Naganuma, both of Yamanashi; Hisashi Arakawa, Kohfu, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/513,349

(22) Filed: Feb. 25, 2000

Related U.S. Application Data

(60) Continuation of application No. 08/934,774, filed on Sep. 22, 1997, now Pat. No. 6,043,114, which is a division of application No. 08/508,483, filed on Jul. 28, 1995, now abandoned.

(30) Foreign Application Priority Data

Jul. 28, 1994 (JP) .............................................. 6-176872
Oct. 28, 1994 (JP) .............................................. 6-265529

(51) Int. Cl.[7] .......................................... H01L 21/8238

(52) U.S. Cl. ...................... 438/199; 438/201; 438/223; 438/222

(58) Field of Search ................................. 438/197, 201, 438/222–223, 226–227

(56) References Cited

U.S. PATENT DOCUMENTS

| 3,974,003 A | 8/1976 | Zirinsky et al. |
| 4,005,453 A | 1/1977 | Le Can et al. |
| 4,477,310 A | 10/1984 | Park et al. |

(List continued on next page.)

FOREIGN PATENT DOCUMENTS

| EP | 0373723 | 6/1990 |
| EP | 0550021 | 7/1993 |
| JP | 58218159 | 12/1983 |
| JP | 60132358 | 7/1985 |
| JP | 61002356 | 1/1986 |
| JP | 63157477 | 6/1988 |

OTHER PUBLICATIONS

Wolf, S., "Silicon Processing for the VLSI Era vol. 1", pp. 64–65.

Ghandhi, S., "VLSI Fabrication Principles Silicon and Gallium Arsenide", pp. 735–738.

(List continued on next page.)

*Primary Examiner*—John F. Niebling
*Assistant Examiner*—Stacy A Whitmore
(74) *Attorney, Agent, or Firm*—Antonelli, Terry, Stout & Kraus, LLP

(57) ABSTRACT

Over the principal surface of a semiconductor substrate body containing an impurity of a predetermined conduction type, there is formed an epitaxial layer which contains an impurity of the same conduction type as that of the former impurity and the same concentration as the designed one of the former impurity. After this, there are formed a well region which has the same conduction type as that of said impurity and its impurity concentration gradually lowered depthwise of said epitaxial layer. The well region is formed with the gate insulating films of MIS.FETs.

17 Claims, 19 Drawing Sheets

U.S. PATENT DOCUMENTS

| | | |
|---|---|---|
| 4,525,920 A | 7/1985 | Jacobs et al. |
| 4,564,416 A | 1/1986 | Homma et al. |
| 4,578,128 A | 3/1986 | Mundt et al. |
| 4,662,082 A | 5/1987 | Dyson et al. |
| 4,684,971 A | 8/1987 | Payne et al. |
| 4,717,686 A | 1/1988 | Jacobs et al. |
| 4,761,384 A * | 8/1988 | Neppl ..................... 438/217 |
| 4,766,090 A | 8/1988 | Coquin et al. |
| 4,803,179 A | 2/1989 | Neppl et al. |
| 4,835,740 A * | 5/1989 | Sato ..................... 365/185.01 |
| 4,943,536 A | 7/1990 | Havemann |
| 5,156,990 A * | 10/1992 | Mitchell ..................... 438/207 |
| 5,216,269 A | 6/1993 | Middelhoek et al. |
| 5,237,188 A | 8/1993 | Iwai et al. |
| 5,290,714 A * | 3/1994 | Onozawa ..................... 438/207 |
| 5,296,047 A | 3/1994 | Fellner ..................... 148/33 |
| 5,396,093 A | 3/1995 | Lu |
| 5,508,540 A | 4/1996 | Ikeda et al. |
| 5,508,549 A | 4/1996 | Watanabe et al. |
| 6,043,114 A * | 3/2000 | Kawagoe ..................... 438/197 |

OTHER PUBLICATIONS

Yamaguchi, et al., "Process integration and device performance of a submicrometer BiCMOS with 16–GHz f (t) double Poly–Bipolar devices", IEEE Transactions on Electron Devices, vol. 36, No. 5, pp. 890–896.

* cited by examiner

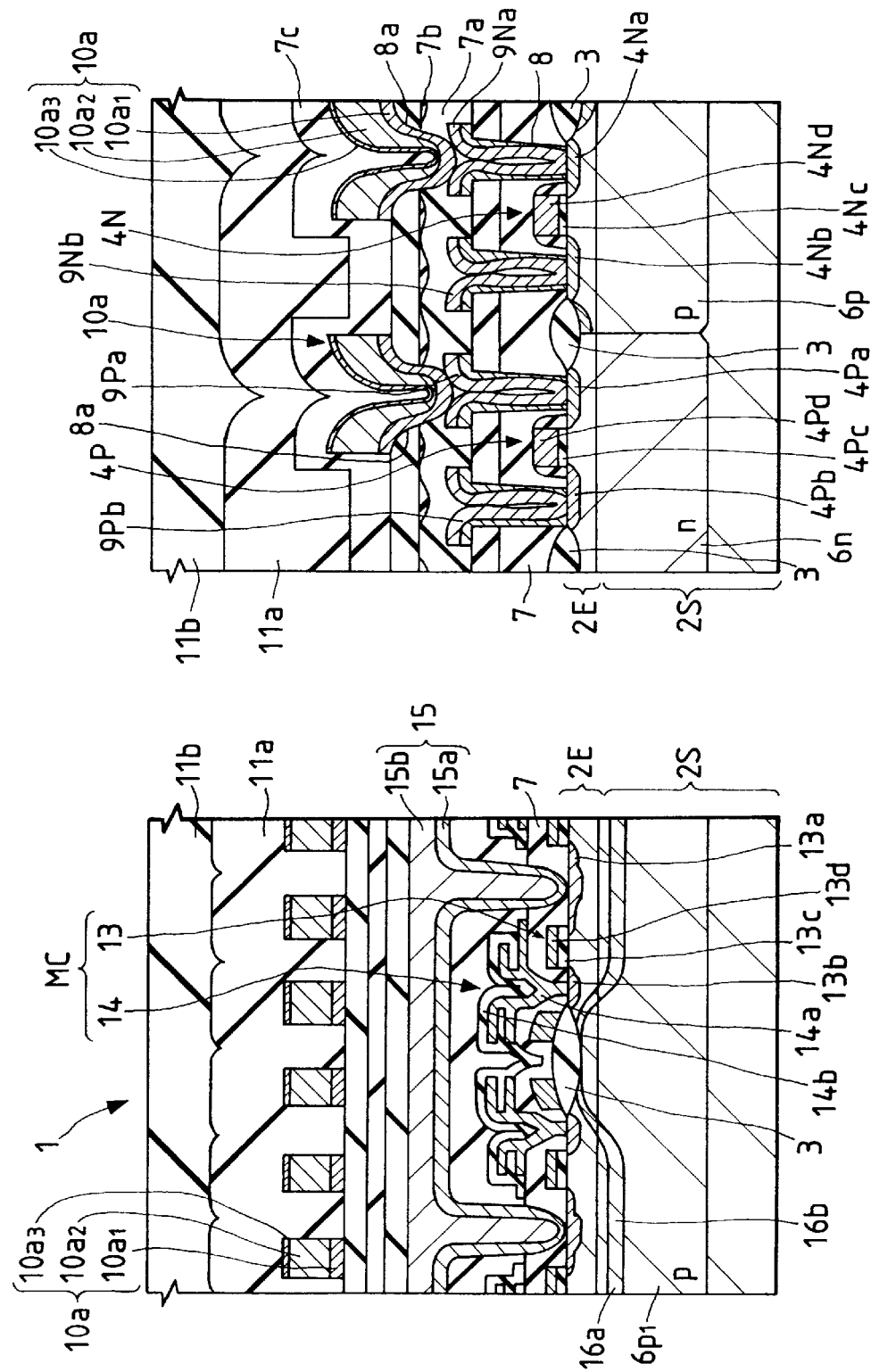

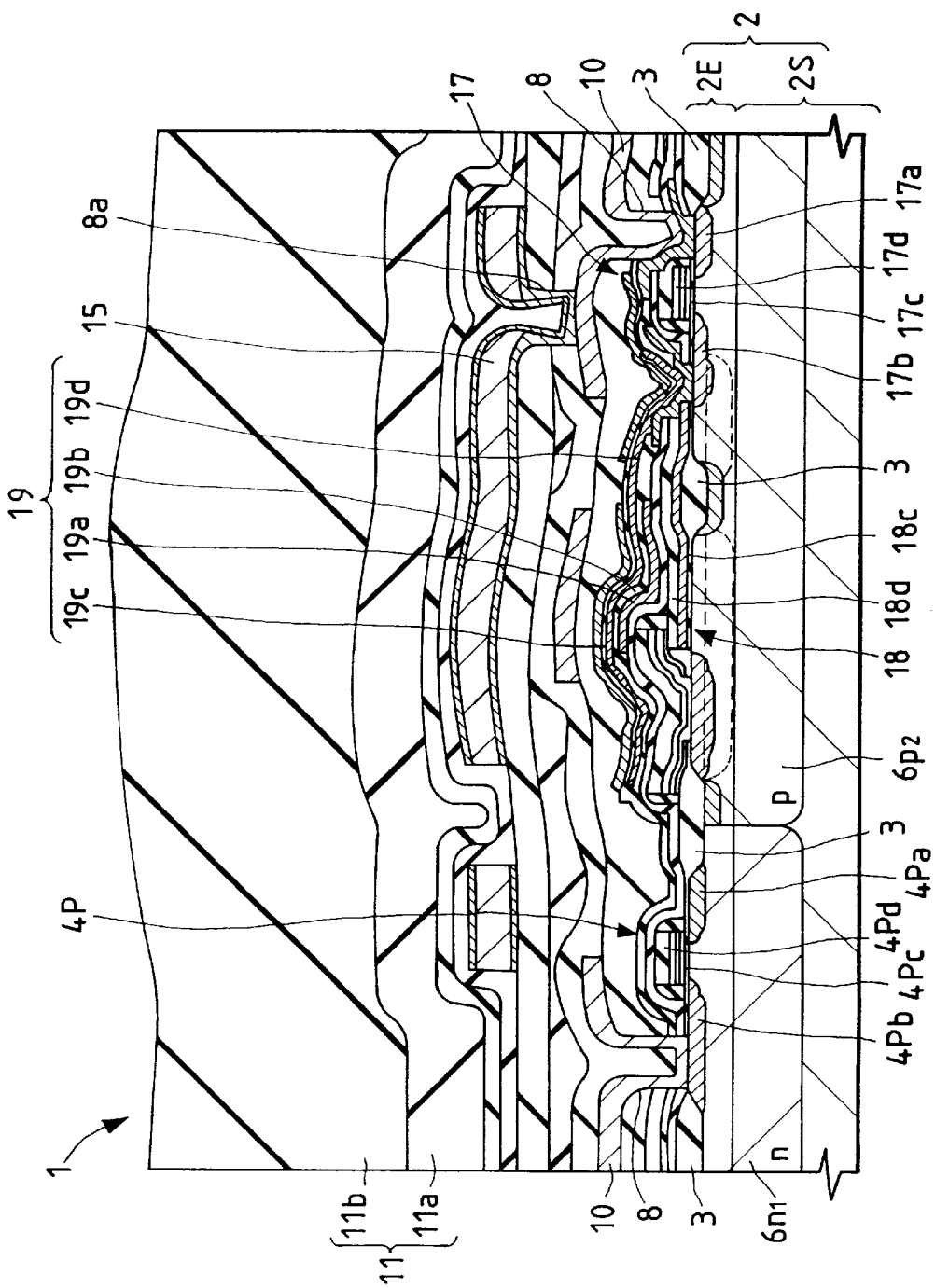

PROCESS FOR MANUFACTURING A SEMICONDUCTOR WAFER, A SEMICONDUCTOR WAFER, PROCESS FOR MANUFACTURING A SEMICONDUCTOR INTEGRATED CIRCUIT DEVICE, AND SEMICONDUCTOR INTEGRATED CIRCUIT DEVICE

This application is a Continuation application of application Ser. No. 08/934,774, filed Sep. 22, 1997, U.S. Pat. No. 6,043,114 which is a Divisional application of application Ser. No. 08/508,483, filed Jul. 28, 1995 abandoned.

BACKGROUND OF THE INVENTION

The present invention relates to a process for manufacturing a semiconductor wafer, a semiconductor wafer, a process for manufacturing a semiconductor integrated circuit device, and a semiconductor integrated circuit device and, more particularly, to a technique which is effective if applied to the so-called "epitaxial wafer manufacturing process" for forming an epitaxial layer over the surface of a semiconductor substrate body, an epitaxial wafer, a process for manufacturing a semiconductor integrated circuit device by using the epitaxial wafer, and a semiconductor integrated circuit device.

An epitaxial wafer is a semiconductor wafer which is formed with an epitaxial layer over the principal surface of a mirror-finished (or -polished) semiconductor mirror wafer (or polished wafer) by epitaxial growth. Incidentally, the epitaxial growth method is described, for example, on pp. 51 to 74 of "VLSI TECHNOLOGY", edited by S. M. Sze and issued in 1983 by McGraw-Hill. On the other hand, the polishing is described on pp. 39 to 42 of the same Publication, for example.

The epitaxial wafer is advantageous in that it is excellent in suppressing the soft errors and resisting to the latchup, and in that the gate insulating film to be formed over the epitaxial layer can have excellent breakdown characteristics to drastically reduce the defect density of the gate insulating film. Thus, application of the epitaxial wafer to the technique for manufacturing the semiconductor integrated circuit device.

As to this epitaxial wafer, there are the following two techniques.

The first technique is described on pp. 761 to 763 of "Applied Physics, Vol. 60, No. 8", issued on Aug. 10, 1991 by Japanese Association of Applied Physics. There is described an epitaxial wafer, in which a $p^+$-type (or $n^+$-type) semiconductor substrate is formed thereover with a p- (or n-) type epitaxial layer containing a p- (or n-) type impurity having a lower concentration than the p- (or n-) type impurity concentration of the semiconductor substrate.

In this case, there is described the structure in which a semiconductor region called the "well" is formed in the epitaxial layer and is formed thereover with a MOS. FET. Since the well of this case is formed by the diffusion of the impurity from the surface of the epitaxial layer, the impurity concentration in the well is distributed to be high in the surface and low in its inside.

The second technique is described in Japanese Patent Laid-Open No. 260832/1989, for example and is directed to an epitaxial wafer which has a p-type epitaxial layer over a p-type semiconductor substrate. In this case, an element forming diffusion layer is formed to extend from the surface of the epitaxial layer to the upper portion of the semiconductor substrate.

Also described is a process, in which the semiconductor substrate body is doped at the time of forming the diffusion layer with a diffusion layer forming impurity so that simultaneously with the growth of the epitaxial layer over the semiconductor substrate body, the impurity in the upper portion of the semiconductor substrate body may be diffused to form the diffusion layer.

The distribution of the impurity concentration of this case is made to have such a plateau curve having a peak at the boundary between the epitaxial layer and the semiconductor substrate body that the impurity concentration is low at the surface side of the epitaxial layer, high at the boundary between the epitaxial layer and the semiconductor substrate body and low in the semiconductor substrate body.

The semiconductor integrated circuit device manufactured according to the aforementioned first technique is excellent in performance and reliability but has a problem in the cost because the semiconductor substrate used contains an ($p^+$-type or $n^+$-type) impurity in high concentration, is expensive, because an epitaxial layer having a large thickness is formed over the semiconductor substrate.

According to the aforementioned second technique, on the other hand, the diffusion layer is formed by the so-called "upper diffusion" to diffuse the impurity in the upper portion of the semiconductor substrate. As a result, the impurity concentration is so difficult to set that there arise a problem that the diffusion layer forming accuracy drops. Another problem is that it is obliged to change the LSI (i.e., Large Scale Integration circuit) manufacturing process using the so-called "mirror wafer".

SUMMARY OF THE INVENTION

An object of the present invention is to provide a technique which can be implemented at comparatively low cost through the use of a semiconductor wafer having a semiconductor single crystal layer over a semiconductor substrate.

Another object of the present invention is to provide a technique capable of improving the performance and reliability of a semiconductor integrated circuit device and simultaneously reducing the cost for the semiconductor integrated circuit device.

An object of the present invention is to provide a technique capable of facilitating the control of forming a semiconductor region on the semiconductor wafer which has the semiconductor single crystal layer over the semiconductor substrate.

An object of the present invention is to provide a technique capable of using a process for manufacturing the semiconductor integrated circuit device using the so-called "mirror wafer", as it is.

The aforementioned and other objects and the novel features of the present invention will become apparent from the following description to be made with reference to the accompanying drawings.

Representatives of the invention disclosed herein will be briefly described in the following.

Specifically, according to the present invention, there is provided a process for manufacturing a semiconductor wafer, comprising the step of forming such a semiconductor single crystal layer over the surface of a relatively lightly doped semiconductor substrate body, which contains an impurity of a predetermined conduction type, as contains an impurity having the same conduction type as that of said impurity and the same concentration as the designed one of said impurity.

Moreover, according to the present invention, there is provided a process for manufacturing a semiconductor integrated circuit device, comprising: the step of preparing a relatively lightly doped semiconductor substrate body, which contains an impurity of a predetermined conduction type with a semiconductor single crystal layer formed over the surface of the semiconductor substrate body and containing an impurity having the same conduction type as that of said impurity and the same concentration as the designed one of said impurity; and the step of forming an oxide film over said semiconductor single crystal layer.

Moreover, according to the present invention, there is provided a process for manufacturing a semiconductor integrated circuit device, comprising: the step of preparing a relatively lightly doped semiconductor substrate body, which contains an impurity of a predetermined conduction type, with a semiconductor single crystal layer formed over the surface of the semiconductor substrate body and containing an impurity having the same conduction type as that of said impurity and a concentration not higher than that of said semiconductor substrate body; the step of forming a first semiconductor region extending from the surface of said semiconductor single crystal layer to the upper portion of said semiconductor substrate body and having the same conduction type as that of said impurity and its impurity concentration gradually lowered depthwise of said semiconductor single crystal layer; and the step of forming an oxide film over said semiconductor region.

Moreover, according to the present invention, there is provided a semiconductor integrated circuit device manufacturing method comprising the step of doping said semiconductor single crystal layer with the ions an impurity and then thermally diffusing said impurity, at the step of forming said first semiconductor region.

Moreover, according to the present invention, there is provided a semiconductor integrated circuit device manufacturing method characterized in that said first semiconductor region is a well to be used for forming a complementary MOS.FET (Metal-Oxide-Semiconductor.Field-Effect-Transistor) circuit (i.e., for forming a complementary MIS (Metal-Insulator-Semiconductor).FET circuit).

According to the aforementioned semiconductor wafer manufacturing process of the present invention, any semiconductor substrate body of high price and density (of $p^+$- or $n^+$-type) need not be used, and the semiconductor single crystal layer can be thinned, so that the cost for the semiconductor wafer capable of realizing high element characteristics and reliability can be lowered.

According to the aforementioned semiconductor integrated circuit device manufacturing process of the present invention, moreover, a gate insulating film having an excellent film quality can be formed by forming the gate insulating film of a MOS.FET over a semiconductor single crystal layer so that the gate insulating film can have its breakdown voltage raised to reduce the defect density of the gate insulating film. Moreover, the semiconductor substrate body of high price and density need not be used, but the semiconductor single crystal layer can be thinned to reduce the cost for the semiconductor integrated circuit device having high element characteristics and reliability.

According to the aforementioned semiconductor integrated circuit device manufacturing process of the present invention, moreover, the degree of freedom for setting the impurity concentration and depth is so high when a semiconductor region such as a well is formed in the semiconductor substrate, as to facilitate the control of the formation.

As a result, it is possible to reduce the defective products thereby to improve the production yield. Moreover, the cost for the semiconductor integrated circuit device can be lowered.

According to the aforementioned semiconductor integrated circuit device manufacturing process of the present invention, moreover, the impurity concentration of the semiconductor substrate body below the semiconductor single crystal layer is made higher than that of the semiconductor single crystal layer, so that the resistance of the semiconductor substrate body can be relatively lowered to improve the resistance to the latchup.

According to the aforementioned semiconductor integrated circuit device manufacturing process of the present invention, moreover, since the first semiconductor region is formed by the ion implantation method and the thermal diffusion method, the semiconductor integrated circuit device can be manufactured without being accompanied by any change in the design or manufacture process but by using the same method as that of the semiconductor integrated circuit device having the so-called "mirror wafer", when it is to be manufactured by using the semiconductor wafer having the semiconductor single crystal layer over the semiconductor substrate body.

According to the aforementioned semiconductor integrated circuit device manufacturing process of the present invention, moreover, since the memory cell of the dynamic type random access memory is formed over the semiconductor single crystal layer having less defects such as the precipitation of oxygen, it is possible to reduce the junction leakage current in the source region and the drain region of the transfer MOS.FET of the memory cell. Since, moreover, the charge leakage in the capacitor of the memory cell can be suppressed to elongate the charge storage time period, it is possible to improve the refresh characteristics. As a result, it is possible to improve the performance, reliability and production yield of the dynamic type random access memory.

According to the aforementioned semiconductor integrated circuit device manufacturing process of the present invention, moreover, since the memory cell of the static type random access memory is formed over the semiconductor single crystal layer having less defects such as the precipitation of oxygen, the junction leakage current of the source region and drain region of the MOS. FET composing the memory cell can be reduced to improve the data retention level thereby to reduce the data retention fault percentage. As a result, it is possible to improve the performance, reliability and production yield of the static type random access memory.

According to the aforementioned semiconductor integrated circuit device manufacturing process of the present invention, moreover, the memory cell of a read only memory capable of electrically erasing and programming data is formed over the semiconductor single crystal layer having less defects such as the precipitation of oxygen, so that the resistance to the data programming can be improved and so that the dispersion of the data erasure can be reduced. As a result, it is possible to improve the performance, reliability and production yield of the read only memory capable of electrically erasing and programming the data.

BRIEF DESCRIPTION OF THE DRAWINGS

FIG. 26(A) is a section showing an essential portion of a semiconductor integrated circuit device according to another embodiment of the present invention;

FIG. 27(A) is a section showing an essential portion of a semiconductor integrated circuit device according to another embodiment of the present invention;

DESCRIPTION OF THE PREFERRED EMBODIMENTS

The present invention will be described in detail in the following in connection with its embodiments with reference to the accompanying drawings.

(Embodiment 1)

Figure 1:
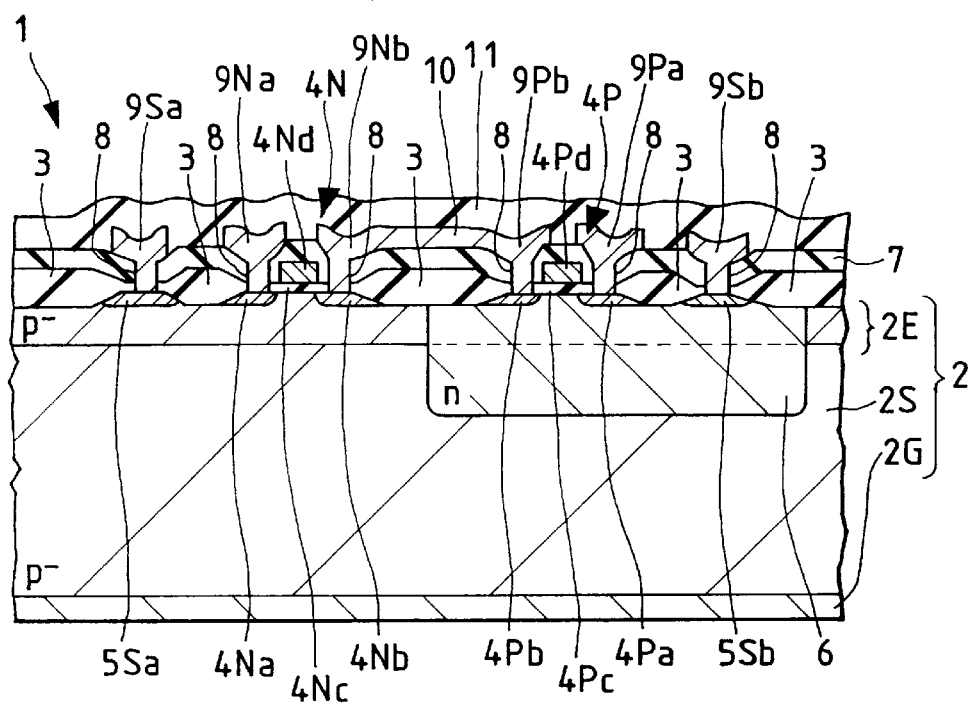
FIG. 1 is a section showing an essential portion of a semiconductor integrated circuit device according to one embodiment of the present invention.
Figure 2:
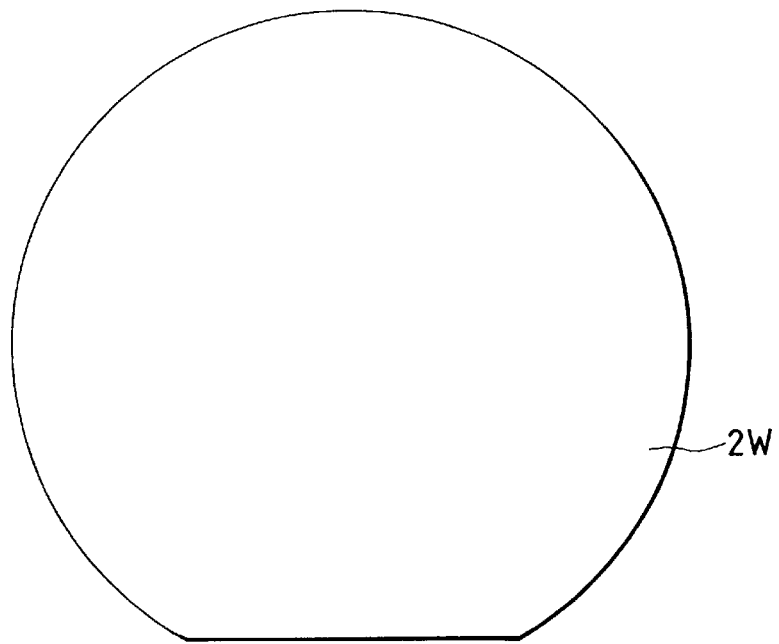
FIG. 2 is a top plan view showing a semiconductor wafer to be used at a step of manufacturing the semiconductor integrated circuit device of FIG. 1.

FIG. 1 is a section showing an essential portion of a semiconductor integrated circuit device according to one embodiment of the present invention; FIG. 2 is a top plan view of a semiconductor wafer to be used in a process for manufacturing the semiconductor integrated circuit device of FIG. 1; and FIGS. 3 to 8 are sections showing an essential portion in a process for manufacturing the semiconductor integrated circuit device of FIG. 1.

As shown in FIG. 1, a semiconductor substrate 2 constituting a semiconductor integrated circuit device 1 of the present embodiment 1 is constructed of a semiconductor substrate body 2S, an epitaxial layer (i.e., semiconductor single crystal layer) 2E and a gettering layer (i.e., trap region) 2G.

Incidentally, the gettering layer is described, for example, on pp. 42 to 44 of "VLSI TECHNOLOGY", edited by S. M. Sze and issued in 1983 by McGraw-Hill.

The semiconductor substrate body 2S is made of a single crystal of $p^-$-type silicon (Si) having a thickness of about 500 to 800 μm, for example. The semiconductor substrate body 2S is doped with a p-type impurity such as boron (B) in a concentration of about $1.3 \times 10^{15}$ atoms/cm$^3$.

Over the principal surface of the semiconductor substrate body 2S, there is formed the epitaxial layer 2E which is made of a single crystal of p$^-$-type Si, for example. This epitaxial layer 2E is doped with a p-type impurity such as boron in a concentration equal to the designed one of the semiconductor substrate body 2S, e.g., $1.3 \times 10^{15}$ atoms/cm$^3$.

Here, the designed impurity concentration is intended to cover an allowable value. Specifically, the equality to the designed impurity concentration means that, in case the semiconductor substrate body 2S has its designed impurity concentration expressed by [impurity concentration: A]± [allowable value: α] and has an actual impurity concentration of A, the semiconductor substrate body 2S and the epitaxial layer 2E have equal impurity concentrations if the actual impurity concentration of the epitaxial layer 2E is not at A but within A±α.

Thus, in the present embodiment 1, the p$^-$-type epitaxial layer 2E is formed over the relatively lightly doped p$^-$-type semiconductor substrate body 2S, and any precious heavily doped p$^+$-type semiconductor substrate body is not used so that the cost for the semiconductor substrate 2 can be reduced to one half or so.

In case the cost for the semiconductor substrate of the prior art having the p$^-$-type epitaxial layer formed over the p$^+$-type semiconductor substrate body, for example, is 2.5 to 3 times as high as that of the ordinary semiconductor substrate having no epitaxial layer. On the contrary, the cost for the semiconductor substrate of the present embodiment 1 can be suppressed within 1.5 times as high as that of the ordinary semiconductor substrate. As a result, the cost for the semiconductor integrated circuit device can be lowered.

The epitaxial layer 2E is made relatively thin to have a thickness of about 1 μm. As a result, the following effects can be attained.

At first, it is easy to control the setting of the thickness or resistivity of the epitaxial layer 2E. Secondly, for the first reason, the apparatus used for forming the epitaxial layer is not required to have a high filming accuracy such as thickness uniformity or doping uniformity of the deposited film so that it needs not be expensive. Thirdly, the epitaxial layer can be easily formed to improve the throughput. Fourthly, for the first, second and third reasons, it is possible to reduce the cost for the semiconductor substrate 2.

The lower limit of the thickness of the epitaxial layer 2E is one half or more of the thickness of the gate insulating film in the later-described MOS.FET. This setting is made while considering that one half of the thickness of the gate insulating film of the MOS.FET goes into the side of the semiconductor substrate 2 when the gate insulating film is formed.

Specifically, in case the epitaxial layer 2E is made thinner than one half of the thickness of a gate insulating film, its entirety is covered with the gate insulating film when this film is to be formed over the epitaxial layer 2E. As a result, the structure is made such that the gate insulating film is formed over the semiconductor substrate body 2S. This structure loses the effect of the case, in which the gate insulating film is formed over the epitaxial layer 2E, namely, that an excellent gate insulating film can be formed to improve its breakdown voltage.

Incidentally, the lower limit of the thickness of the epitaxial layer 2E is frequently set to 0.3 μm by evaluating the performance of the gate insulating film (e.g., the gate breakdown voltage), as will be described with reference to FIG. 25.

On the other hand, the upper limit of the thickness of the epitaxial layer 2E cannot be generally said because it depends upon the product or manufacturing conditions, but may desirably be less than 5 μm, for example, if the following is considered.

Specifically, first of all, the upper surface of the epitaxial layer 2E can retain flatness. If the epitaxial layer 2E is made thicker, the level difference of the principal surface of the semiconductor substrate body 2S is accordingly increased, but no substantial difference is caused by the thickness of such extent.

If the principal surface has an excessively large roughness, a larger level difference than the focal depth may be made in a photolithography for the later-described MIS device forming step, thus causing a problem that the pattern cannot be formed by the photolithography.

Secondly, the cost for the mother material of the semiconductor substrate 2 or the semiconductor wafer (i.e., the later-described epitaxial wafer) can be suppressed within a low price. If the epitaxial layer 2E is thickened, it is difficult to control the filming operation, as described above, so that the cost for the semiconductor wafer (i.e., the later-described epitaxial wafer) rises. However, this thickness will not invite a drastic increase in the cost.

Thirdly, the roughness, if any, on the principal surface of the semiconductor substrate body 2S can be ignored. With the thickness of this order, the roughness will not make a large level difference.

Fourthly, when the epitaxial layer is to be formed over the semiconductor wafer (i.e., the later-described mirror wafer), it is possible to prevent any roughness (i.e., crown) from being formed in the vicinity of the outer circumference of the principal surface of the semiconductor wafer (i.e., the later-described mirror wafer). In case a thick epitaxial layer is to be formed over the semiconductor wafer (i.e., the later-described mirror wafer), the roughness called the crown will be formed in the vicinity of the outer periphery of the principal surface of the semiconductor wafer (i.e., the later-described mirror wafer). With the thickness of that order, the roughness is not formed (or can be ignored).

Considering the aforementioned points, the thickness of the epitaxial layer 2E is preferred to range from 0.3 μm to 5 μm. However, the range of 0.3 μm to 3 μm is frequently employed, and the optimum range is from 0.3 μm to 1.0 μm.

Over the principal surface of the epitaxial layer 2E, there is formed a field insulating film 3 which is made of silicon dioxide (SiO$_2$), for example. Incidentally, a channel stopper region is formed below the field insulating film 3, although not shown.

The element forming region, as enclosed by the field insulating film 3, is formed, for example, with an n-channel MOS.FET (as will be shortly referred to as "nMOS") 4N and a p-channel MOS. FET (as will be shortly referred to as "pMOS") 4P, and these nMOS 4N and pMOS 4P constitute a CMOS (i.e., Complementary Metal Oxide Semiconductor) circuit. Incidentally, the following description is directed to the MOS.FET, but the present invention may naturally be modified by a MIS.FET.

In the present embodiment 1, however, both the nMOS 4N and the pMOS 4P are given an ordinary MOS.FET structure but should not be limited thereto and may be made of MOS.FETs having the LDD (i.e., Lightly Doped Drain) structure.

The nMOS 4N has the following components. Specifically, the nMOS 4N is composed of: a pair of semiconductor regions 4Na and 4Nb formed in the epitaxial layer 2E and apart from each other; a gate insulating film 4Nc formed over the epitaxial layer 2E; and a gate electrode 4Nd formed over the gate insulating film 4Nc.

The semiconductor regions 4Na and 4Nb are regions for forming the source-drain regions of the nMOS 4N. The semiconductor regions 4Na and 4Nb are doped with an n-type impurity such as phosphor (P) or arsenic (As) in a concentration (dose) of about $1\times10^{15}$ atoms/cm$^2$. The semiconductor regions 4Na and 4Nb are made as deep as about 0.5 µm and formed in the range of the thickness of the epitaxial layer 2E.

The gate insulating film 4Nc is made of SiO$_2$ having a thickness of about 18 nm, for example, and formed over the epitaxial layer 2E. As a result, the following effects can be achieved.

First of all, by forming the gate insulating film 4Nc of the MOS FET over the semiconductor single crystal layer 2E formed of the epitaxial layer 2E, the gate insulating film 4Nc having an excellent film quality can be formed, as described above, to improve its breakdown voltage. Secondly, the defect density (i.e., the number of defects to be caused within a predetermined range) of the gate insulating film 4Nc can be improved (reduced) by one figure or more.

The gate electrode 4Nd is made of a single layer film of poly-silicon having a low resistance, for example. Here, the gate electrode 4Nd is not limited to the single layer film of poly-silicon of low resistance but can be modified in various manners. For example, the gate electrode 4Nd may be constructed by laminating a silicide film of tungsten silicide (WSi$_2$) over the poly-silicon film of low resistance.

Incidentally, a semiconductor region 5Sa formed over the epitaxial layer 2E is a region for setting the substrate potential at the side of the nMOS 4N. This semiconductor region 5Sa is doped with a p-type impurity such as boron in a concentration (.dose) of about $1\times10^{15}$ atoms/cm$^2$.

On the other hand, the pMOS 4P is formed in an n-well 6 which is formed over the semiconductor substrate 2. The n-well 6 is doped with an n-type impurity such as phosphor or arsenic in a concentration (dose) of $1\times10^{13}$ atoms/cm$^2$. The n-well 6 is as deep as about 1.5~4 µm and extends deeper than the epitaxial layer 2E. Specifically, the n-well 6 is formed in the epitaxial layer 2E and the semiconductor substrate body 2S to have a larger depth than the film thickness of the epitaxial layer 2E.

The pMOS 4P has the following components. Specifically, the pMOS 4P is composed of: a pair of semiconductor regions 4Pa and 4Pb formed over the epitaxial layer 2E and apart from each other; a gate insulating film 4Pc formed over the epitaxial layer 2E; and a gate electrode 4Pd formed over the gate insulating film 4Pc.

The semiconductor regions 4Pa and 4Pb are regions for forming the source-drain regions of the pMOS 4P. The semiconductor regions 4Pa and 4Pb are doped with an p-type impurity such as boron in a concentration (dose) of about $1\times10^{18}$ atoms/cm$^2$. The semiconductor regions 4Pa and 4Pb are made as deep as about 0.5 µm and formed in the range of the thickness of the epitaxial layer 2E.

The gate insulating film 4Pc is made of SiO$_2$ having a thickness of about 18 nm, for example, and formed over the epitaxial layer 2E. As a result, the same effects as those of the nMOS 4N can be achieved.

First of all, the gate insulating film 4Pc having an excellent film quality can be formed, to improve its breakdown voltage. Secondly, the defect density of the gate insulating film 4Pc can be improved (or reduced) by one figure or more.

The gate electrode 4Pd is made of a single layer film of poly-silicon having a low resistance, for example. Here, the gate electrode 4Pd is not limited to the single layer film of poly-silicon of low resistance but can be modified in various manners. For example, the gate electrode 4Pd may be constructed by laminating a silicide film of WSi$_2$ over the poly-silicon film of low resistance.

Incidentally, a semiconductor region 5Sb formed over the epitaxial layer 2E is a region for setting the substrate potential at the side of the pMOS 4P. This semiconductor region 5Sb is doped with an n-type impurity such as phosphor or arsenic in a concentration (dose) of about $1\times10^{18}$ atoms/cm$^2$.

On the semiconductor substrate 2, there is deposited an insulating film 7 which is made of SiO$_2$, for example. This insulating film 7 is formed in predetermined positions with connection holes 8 for exposing the semiconductor regions 4Na and 4Nb of the nMOS 4N, the semiconductor regions 4Pa and 4Pb of the pMOS 4P, and the semiconductor regions 5Sa and 5Sb for the substrate potential to the outside.

The semiconductor regions 4Na and 4Nb of the aforementioned nMOS 4N are electrically connected with electrodes 9Na and 9Nb, respectively, through the connection holes 8. On the other hand, the semiconductor regions 4Pa and 4Pb of the pMOS 4P are electrically connected with electrodes 9Pa and 9Pb, respectively, through the connection hole 8. Moreover, the semiconductor region 4Nb of the nMOS 4N is electrically connected with the semiconductor region 4Pb of the pMOS 4P through a first-layer wiring line 10 connecting the electrodes 9Nb and 9Pb.

On the other hand, the semiconductor regions 5Sa and 5Sb for the substrate potential are electrically connected with electrodes 9Sa and 9Sb, respectively, through the connection holes 8.

Those electrodes 9Na, 9Nb, 9Pa, 9Pb, 9Sa and 9Sb and first-layer wiring line 10 are made of an alloy of aluminum (Al)-Si-Copper (Cu), for example.

On the insulating film 7, there is deposited a surface protecting film 11 which is formed by laminating a SiO$_2$ film and a silicon nitride (Si$_3$N$_4$) sequentially from the lower layer, for example. The surface protecting film 11 covers the electrodes 9Na, 9Nb, 9Pa, 9Pb, 9Sa and 9Sb and the first-layer wiring line 10.

On the other hand, the semiconductor substrate 2 is formed on its back with a gettering layer 2G. This gettering layer 2G is a functional layer for trapping a heavy metal element such as iron (Fe), nickel (Ni), Cu or chromium (Cr) and is formed by covering the back of the semiconductor substrate 2 with a semiconductor film of poly-silicon, for example.

With reference to FIGS. 1 to 8, here will be described a process for manufacturing a semiconductor integrated circuit device according to the present embodiment 1.

First of all, a (not-shown) column-shaped p$^-$-type Si single crystal having a crystal face of <100> azimuth is prepared by the Czochralski method. The impurity to be used is exemplified by a p-type impurity such as boron in a concentration of about $1.3\times10^{15}$ atoms/cm$^3$.

Figure 3:
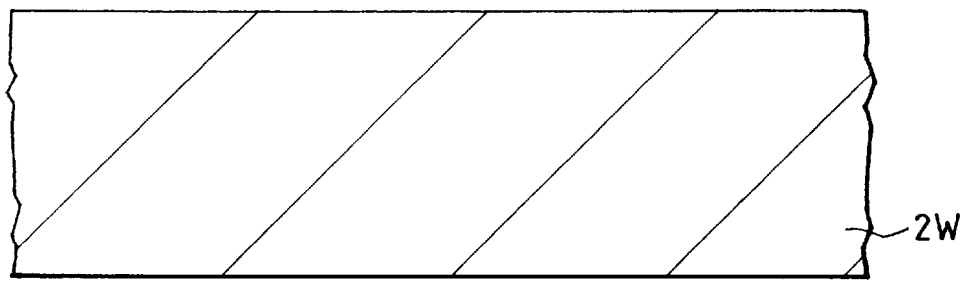
FIG. 3 is a section showing an essential portion at a step of manufacturing the semiconductor integrated circuit device of FIG. 1.

Subsequently, the column-shaped p$^-$-type Si single crystal cut into slices, and these slices are subjected, if desired, to a chamfering treatment, a surface cleaning treatment such as a chemical etching treatment, and a working strain removing treatment. After this, the slices have their principal surfaces mirror-polished by the chemical-mechanical polishing method or the like to prepare a mirror wafer 2W, as shown in FIGS. 2 and 3. Incidentally, the mirror wafer 2W is the mother material of the aforementioned semiconductor substrate body 2S.

Figure 4:
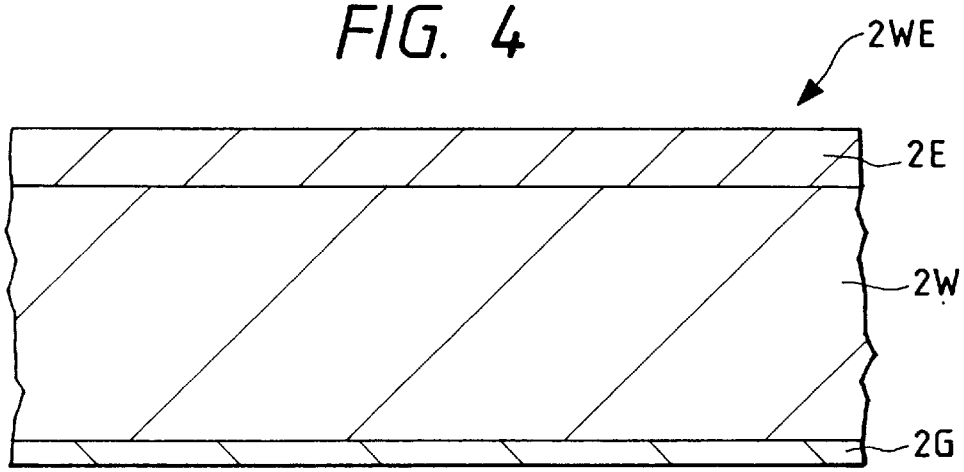
FIG. 4 is a section showing an essential portion at the step, as subsequent to FIG. 3, of manufacturing the semiconductor integrated circuit device of FIG. 1.

Next, the poly-silicon is deposited on the back of the mirror wafer 2W, as shown in FIG. 4, by the CVD (i.e., Chemical Vapor Deposition) method to form the gettering layer 2G. This gettering layer 2G is a functional layer for trapping a heavy metal element.

Subsequently, the epitaxial layer 2E, which is made of a p⁻-type Si single crystal as thin as about 1 μm, is formed over the principal surface (as located at the mirror surface side) of the mirror wafer 2W by the CVD method (e.g., the epitaxial growth method) of about 980° C., for example, by using monosilane ($SiH_4$) gas and hydrogen ($H_2$) gas, thereby to manufacture an epitaxial wafer (or semiconductor wafer) 2WE.

At this time, the impurity concentration in the epitaxial layer 2E is set equal to the designed one of the mirror wafer 2W. The epitaxial layer 2E is doped with a p-type impurity such as boron in a concentration of about $1.3 \times 10^{15}$ atoms/$cm^3$.

Figure 5:
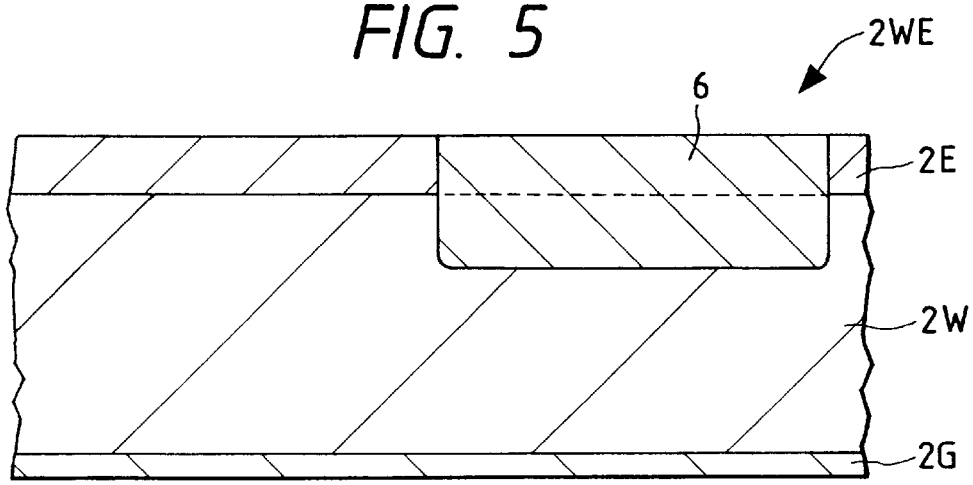
FIG. 5 is a section showing an essential portion at the step, as subsequent to FIG. 4, of manufacturing the semiconductor integrated circuit device of FIG. 1.

After this, the not-shown ion implantation mask is formed over the epitaxial wafer 2WE and is then used to dope a predetermined position of the epitaxial wafer 2WE, as shown in FIG. 5, with an n-type impurity such as phosphor or arsenic by the ion implantation method. After this, the epitaxial wafer 2WE is subjected to a heat treatment to form the n-well 6.

An ion implantation impurity concentration (dose) for forming that n-well 6 is at about $1 \times 10^{13}$ atoms/$cm^2$ and is as deep as about 1.5 to 4 μm and deeper than the epitaxial layer 2E.

Figure 6:
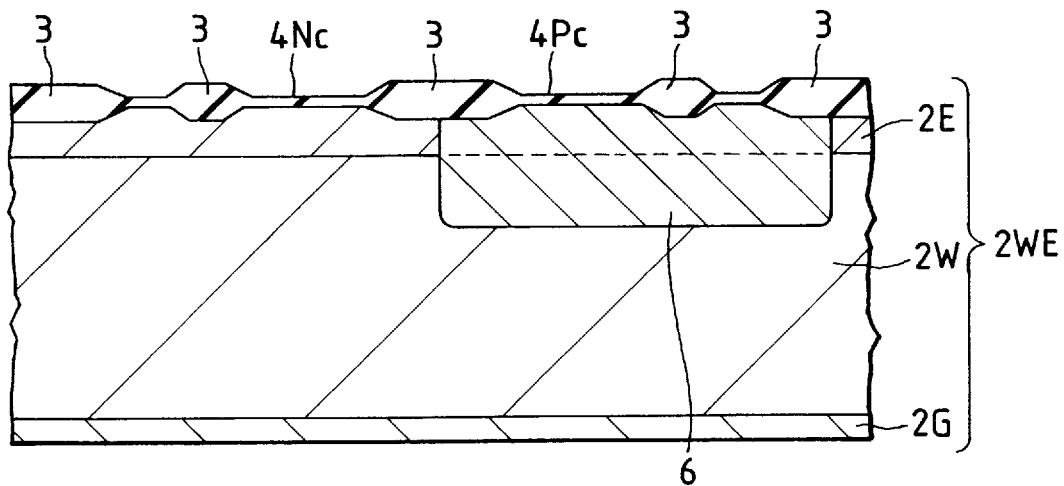
FIG. 6 is a section showing an essential portion at the step, as subsequent to FIG. 5, of manufacturing the semiconductor integrated circuit device of FIG. 1.

Next, as shown in FIG. 6, the field insulating film 3 made of $SiO_2$ or the like is formed over the principal surface of the epitaxial layer 2E by the LOCOS method-or the like. After this, the element forming region, as enclosed by the field insulating film 3, is simultaneously formed with the gate insulating films 4Nc and 4Pc made of $SiO_2$ or the like having a thickness of about 180 angstroms by the thermal oxidation method or the like.

In the present embodiment 1, the gate insulating films 4Nc and 4Pc can be formed to have an excellent film quality by forming them over the epitaxial layer 2E so that their breakdown voltages can be improved. Moreover, the gate insulating films 4Nc and 4Pc can have their defect densities improved by one figure or more.

Figure 7:
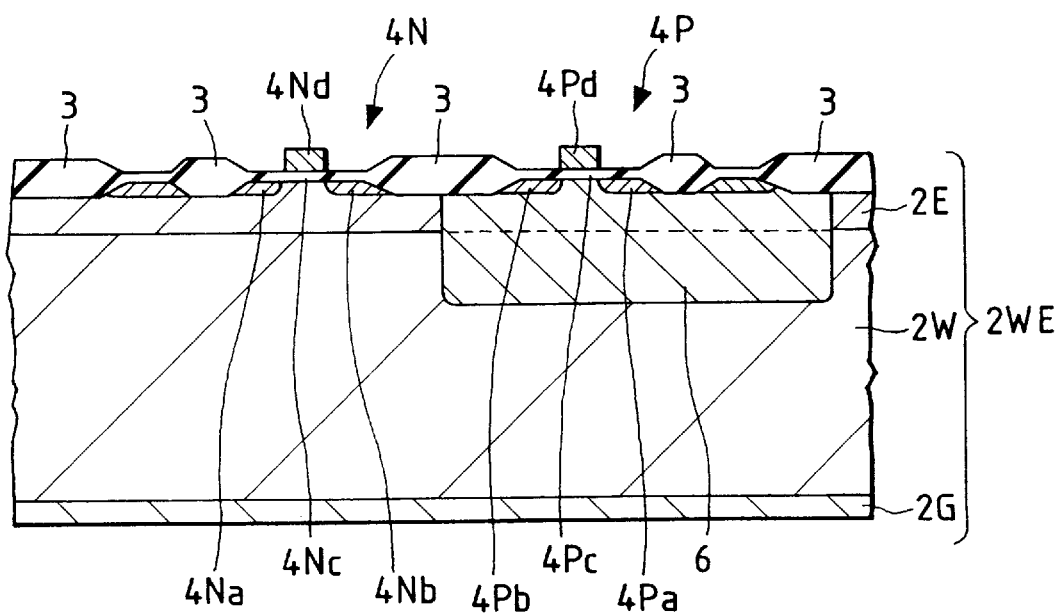
FIG. 7 is a section showing an essential portion at the step, as subsequent to FIG. 6, of manufacturing the semiconductor integrated circuit device of FIG. 1.

Subsequently, as shown in FIG. 7, the gate insulating films 4Nd and 4Pd of poly-silicon having a low resistance are simultaneously formed over the gate insulating films 4Nc and 4Pc. After this, the gate insulating films 4Nd and 4Pd are used as masks to form the paired gate insulating films 4Na and 4Nb and the paired gate insulating films 4Pa and 4Pb by different ion implantation steps, to form the nMOS 4n and pMOS 4P over the epitaxial wafer 2WE.

Figure 8:
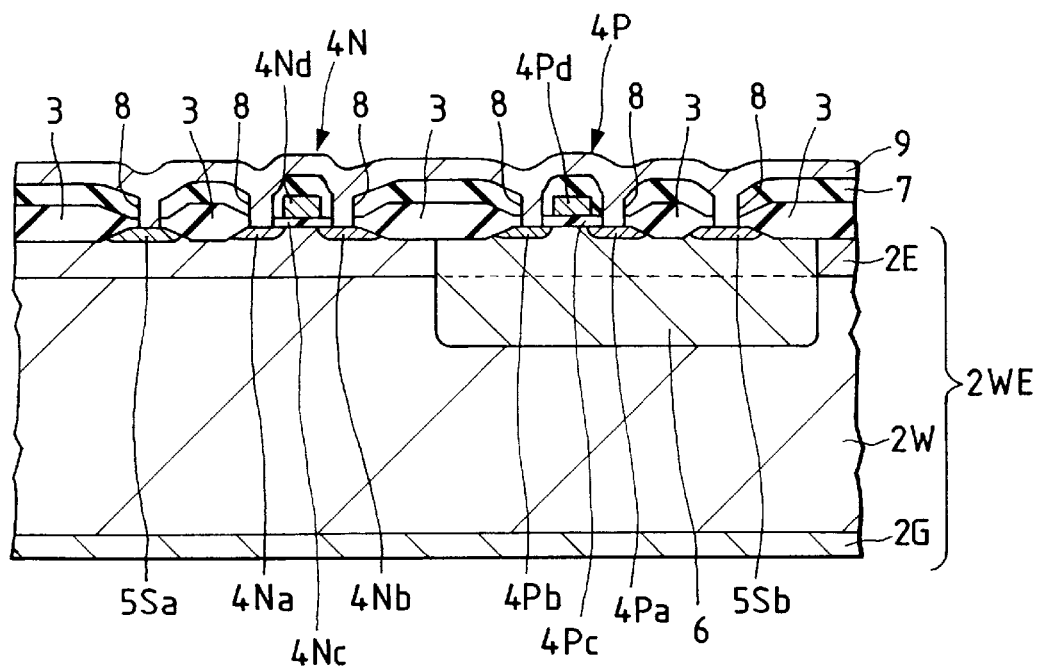
FIG. 8 is a section showing an essential portion at the step, as subsequent to FIG. 7, of manufacturing the semiconductor integrated circuit device of FIG. 1.

After this, the semiconductor regions 5Sa and 5Sb are separately formed in predetermined positions of the epitaxial layer 2E. After this, as shown in FIG. 8, the insulating film 7 made of $SiO_2$, for example, is deposited over the epitaxial wafer 2WE by the CVD method or the like.

Next, the insulating film 7 is formed with the connection holes 8 to expose the semiconductor regions 4Na and 4Nb of the nMOS 4N, the semiconductor regions 4Pa and 4Pb of the pMOS 4P and the semiconductor regions 5SA and 5Sb for the substrate potential to the outside. After this, a conductor film 9 made of the Al—Si—Cu alloy, for example, is deposited over the epitaxial wafer 2WE by the sputtering method or the evaporation method.

Subsequently, the conductor film 9 is patterned by the dry etching method or the like to simultaneously form the electrodes 9Na, 9Nb, 9Pa, 9Pb, 9Sa and 9Sb and the first wiring line 10, as shown in FIG. 1.

After this, the surface protecting film 11 is formed over the epitaxial wafer 2WE by sequentially depositing the insulating film of $SiO_2$ and the insulating film of $Si_3N_4$, for example, by the CVD method or the like. After this, the epitaxial wafer 2WE is divided into individual semiconductor chips to manufacture the semiconductor integrated circuit device 1, as shown in FIG. 1.

Thus, according to the present embodiment 1, the following effects can be achieved.

(1) Since the gate insulating film 4Nc of the nMOS 4N and the gate insulating film 4Pc of the pMOS 4P are formed over the epitaxial layer 2E (or the semiconductor single crystal layer), the gate insulating films 4Nc and 4Pc having the excellent film quality can be formed to improve their breakdown voltages.

(2) Thanks to the aforementioned effect (1), it is possible to drastically reduce the defect densities of the gate insulating films 4Nc and 4Pc.

(3) Since the p⁻-type epitaxial layer 2E is formed over the p⁻-type semiconductor substrate body 2S so that any expensive heavily doped p⁺-type semiconductor substrate body is not used, the cost for the semiconductor substrate 2 (i.e., the epitaxial wafer 2WE) can be reduced to as low as one half.

(4) Since the epitaxial layer 2E is made relatively thin, the control of setting of the thickness of the epitaxial layer 2E is easily accomplished so that the deposition apparatus for forming the epitaxial layer is neither required to have a precise control of deposition nor expensive. As a result, it is possible to lower the cost for the semiconductor substrate 2 (i.e., the epitaxial wafer 2WE).

(5) Thanks to the aforementioned effects (3) and (4), it is possible to lower the cost for the semiconductor integrated circuit device.

(6) Since the epitaxial layer 2E is made relatively thin, its upper surface can have its flatness retained.

(7) Thanks to the aforementioned effects (1), (2) and (6), it is possible to improve the performance, reliability and production yield of the semiconductor integrated circuit device.

(Embodiment 2)

Figure 9:
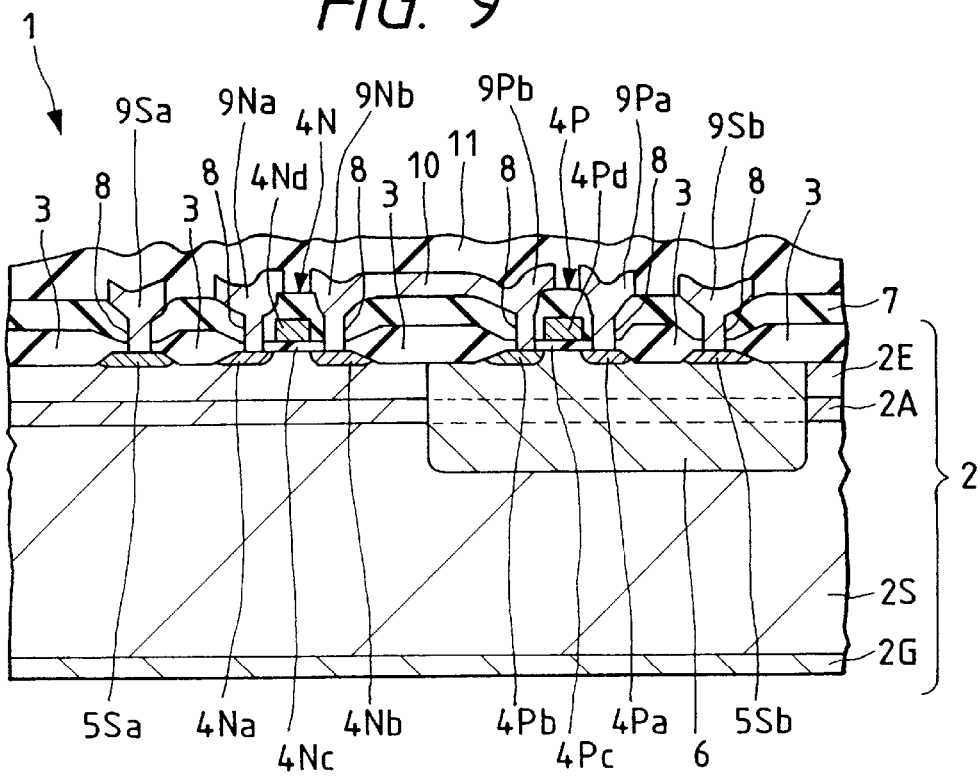
FIG. 9 is a section showing an essential portion of a semiconductor integrated circuit device according to another embodiment of the present invention.
Figure 10:
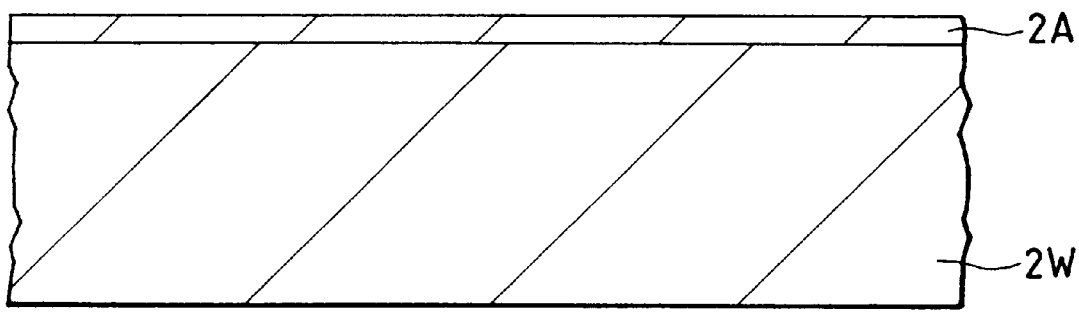
FIG. 10 is a section showing an essential portion at a step of manufacturing the semiconductor integrated circuit device of FIG. 9.
Figure 11:
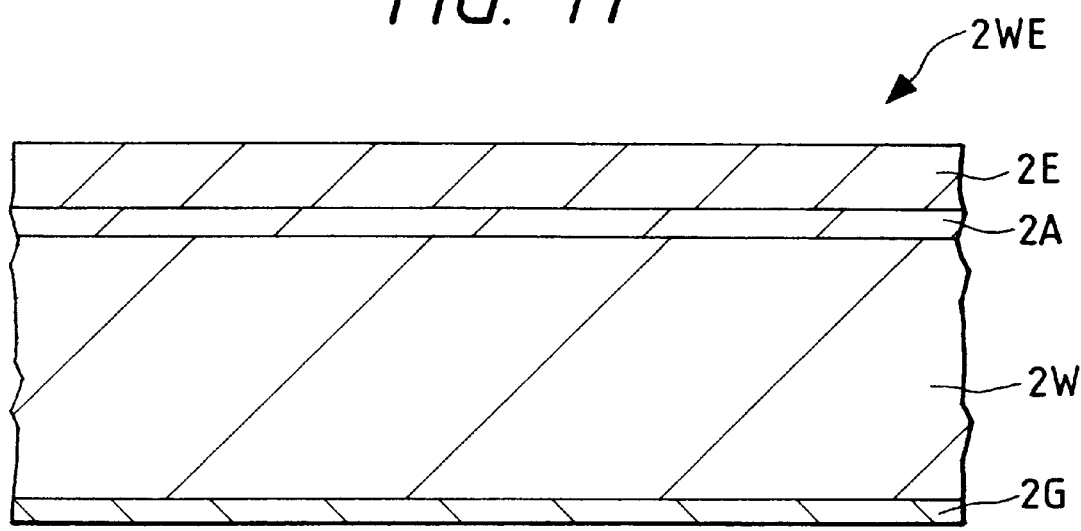
FIG. 11 is a section showing an essential portion at the step, as subsequent to FIG. 10, of manufacturing the semiconductor integrated circuit device of FIG. 9.

FIG. 9 is a section showing an essential portion of a semiconductor integrated circuit device according to another embodiment of the present invention, and FIGS. 10 and 11 are sections showing an essential portion at steps of manufacturing the semiconductor integrated circuit device of FIG. 9.

The present embodiment 2 is different from the embodiment 1 in that the semiconductor substrate body 2S is formed over its principal surface with a nondefective layer 2A, which is formed thereover with the epitaxial layer 2E.

The non-defective layer 2A is in the state having substantially neither any structural defect (e.g., the stacking fault or the dislocation loop) nor any precipitation of oxygen, of which the former is substantially zero whereas the latter is at about 0.1 $cm^{-2}$, when observed by the light scattering method. For example, the non-defective layer 2A is made of a p⁻-type Si single crystal which have an impurity content and a concentration equal to those of the semiconductor substrate body 2S.

With reference to FIGS. 9 to 11, here will be described the process for manufacturing the semiconductor integrated circuit device 1 of the present embodiment 2.

First of all, as shown in FIG. 10, the mirror wafer 2W is prepared as in the foregoing embodiment 1. After this, the mirror wafer 2W is heated at a temperature (e.g., at about 1,100° C. to 1,200° C. for 10 to 60 minutes) in the $H_2$ gas atmosphere, for example, to form the non-defective layer 2A over the principal surface of the mirror wafer 2W.

Subsequently, as shown in FIG. 11, poly-silicon, for example, is deposited on the back of the mirror wafer 2W by the CVD method or the like to form the gettering layer 2G. This gettering layer 2G is a functional layer for trapping a heavy metal element.

After this, the epitaxial layer 2E made of a p⁻-type Si single crystal having a relatively small thickness of about 1 $\mu$m, for example, is formed over the non-defective layer 2A by the CVD method (e.g., the epitaxial growth method) using $SiH_4$ gas and $H_2$ gas, for example. At this time, the impurity and its concentration in the epitaxial layer 2E are similar to those of the foregoing embodiment 1. Moreover, the subsequent steps are similar to those of the aforementioned embodiment 1, and their description will be omitted.

Thus, according to the present embodiment 2, the following effects can be achieved in addition to those obtained in the foregoing embodiment 1.

Specifically, since the non-detective layer 2A is formed over the principal surface of the mirror wafer 2W prior to the formation of the epitaxial layer 2E, the epitaxial layer 2E can be improved in its crystal growth to reduce the defects and dislocations drastically. As a result, it is possible to further improve the production yield, performance and reliability of the semiconductor integrated circuit device.

(Embodiment 3)

Figure 12:
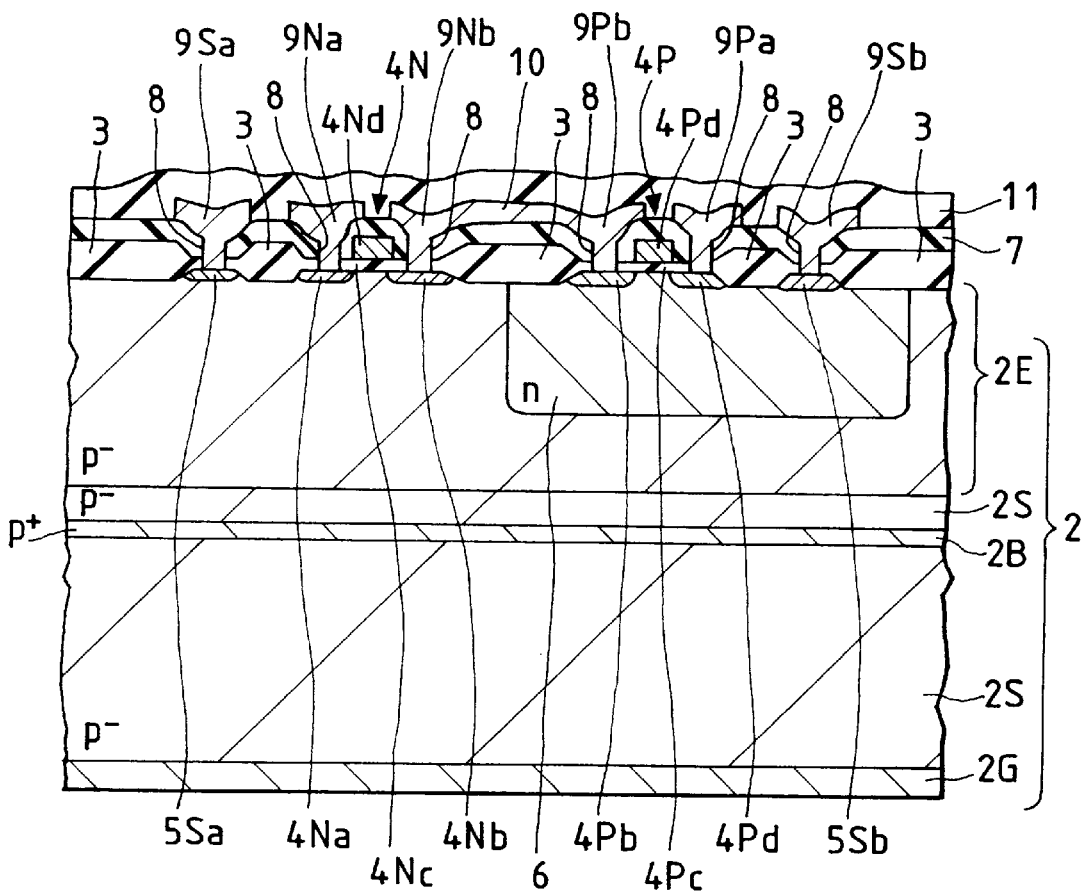
FIG. 12 is a section showing an essential portion of a semiconductor integrated circuit device according to another embodiment of the present invention.
Figure 13:
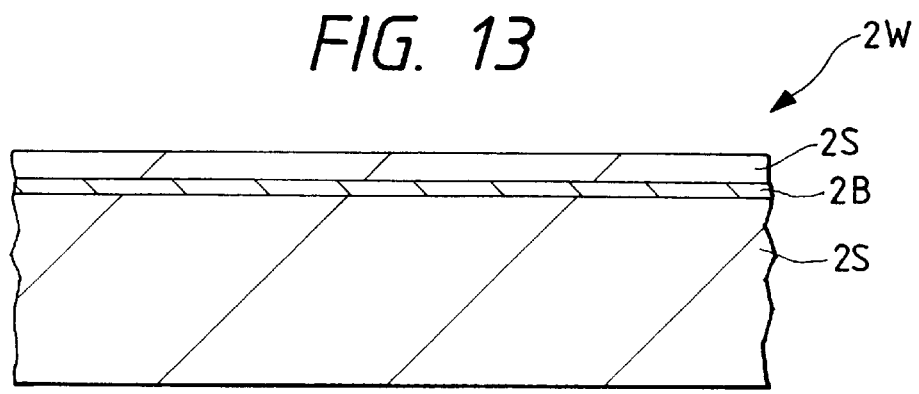
FIG. 13 is a section showing an essential portion at a step of manufacturing the semiconductor integrated circuit device of FIG. 12.
Figure 14:
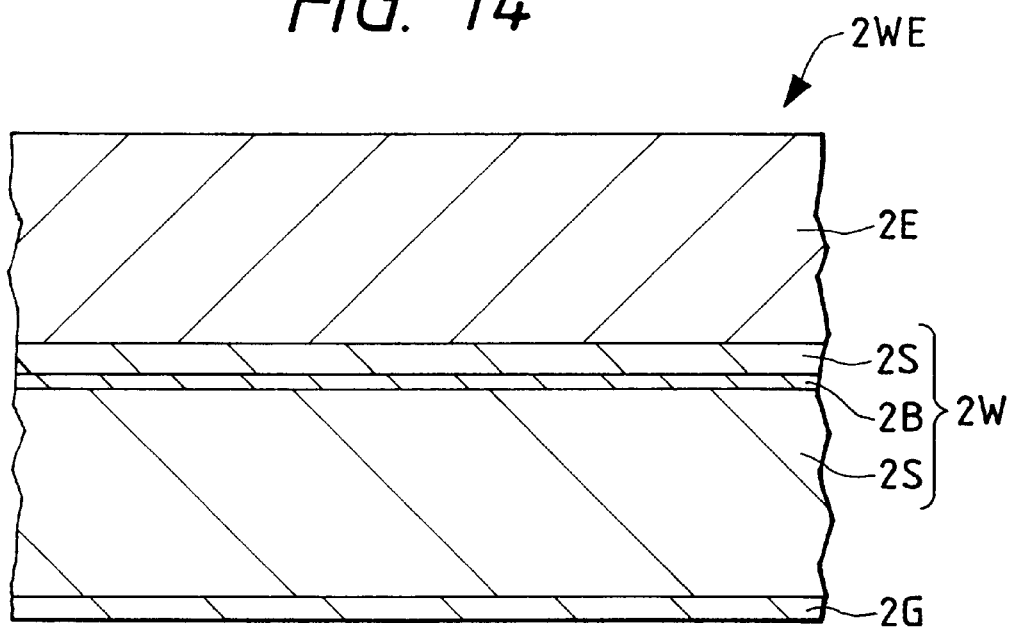
FIG. 14 is a section showing an essential portion at the step, as subsequent to FIG. 13, of manufacturing the semiconductor integrated circuit device of FIG. 12.
Figure 15:
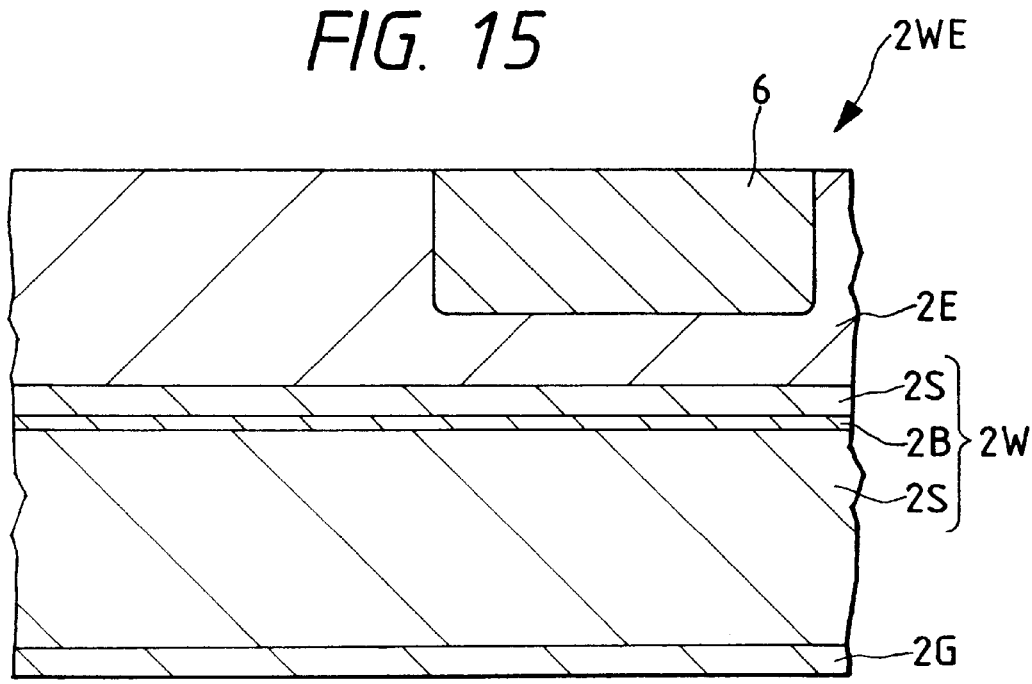
FIG. 15 is a section showing an essential portion at the step, as subsequent to FIG. 14, of manufacturing the semiconductor integrated circuit device of FIG. 12.

FIG. 12 is a section showing an essential portion of a semiconductor integrated circuit device according to another embodiment of the present invention, and FIGS. 13 to 15 are sections showing an essential portion in the steps of manufacturing the semiconductor integrated circuit device of FIG. 12.

In the present embodiment 3, as will be described later in connection with the forming method with reference to FIG. 13, a p⁺-type semiconductor region (i.e., a heavily doped semiconductor region) 2B is formed in a predetermined depth (of about 1 $\mu$m) of the entire principal surface of the semiconductor substrate body 2S. The p⁺-type semiconductor region 2B is doped with a p-type impurity such as boron in a higher concentration of about $1\times10^{18}$ atoms/cm³ than that of the epitaxial layer 2E or the semiconductor substrate body 2S.

The p⁺-type semiconductor region 2B is a functional layer for suppressing the latchup of the CMOS circuit. Specifically, in the present embodiment 3, the p⁺-type semiconductor region 2B is formed so that the resistance of the surface layer side of the substrate can be drastically lowered to improve the resistance of the CMOS circuit to the latchup.

Moreover, the epitaxial layer 2E is thicker at about 5 $\mu$m than those of the foregoing embodiments 1 and 2. The lower limit of the thickness of the epitaxial layer 2E is set to a deeper value than that of the n-well 6 in the pMOS forming region.

This is because the p⁺-type semiconductor region 2B is formed in the n-well 6 to make it difficult to set the impurity concentration in the n-well 6 if the thickness of the epitaxial layer 2E is made smaller than the depth of the n-well 6. On the other hand, the upper limit of the thickness of the epitaxial layer 2E may desirably be less than 5 $\mu$m. This is reasoned as in the foregoing embodiment 1. However, the thickness may exceed that value so long as an increase in the cost is allowed.

With reference to FIGS. 13 to 15, here will be described the process for manufacturing such semiconductor integrated circuit device 1.

First of all, as shown in FIG. 13, the mirror wafer 2W is prepared as in the foregoing embodiment 1. After this, the mirror wafer 2W (or the semiconductor substrate body 2S) is highly accurately doped with a p-type impurity such as boron to a predetermined depth (e.g., about 1 $\mu$m) from its principal surface. The impurity concentration at this time is about $1\times10^{18}$ atoms/cm³.

Subsequently, the mirror wafer 2W is thermally treated to form the p⁺-type semiconductor region 2B. After this, a poly-silicon, for example, is deposited on the back of the mirror wafer 2W by the CVD method or the like to form the gettering layer 2G. This gettering layer 2G is a functional layer for trapping a heavy metal element.

After this, the epitaxial layer 2E (or the semiconductor single crystal layer) made of a p⁻-type Si single crystal having a thickness of about 5 $\mu$m, for example, is formed over the principal surface (as located at the mirror surface side) of the mirror wafer 2W, as shown in FIG. 14, by the CVD method (i.e., the epitaxial growth method) using $SiH_4$ and $H_2$ gas, for example, to form the epitaxial wafer 2WE.

At this time, the impurity concentration in the epitaxial layer 2E is set to be equal to the designed one of the mirror wafer 2W. The epitaxial layer 2E is doped with a p-type impurity such as boron, for example, in a concentration of about $1.5\times10^{15}$ atoms/cm³.

After this, the not-shown ion implantation mask is formed over the epitaxial wafer 2WE and is then used as a mask to dope a predetermined position of the epitaxial wafer 2WE, as shown in FIG. 15, with an n-type impurity such as phosphor or arsenic by the ion implantation method. After this, the epitaxial wafer 2WE is subjected to a heat treatment to form the n-well 6.

In the present embodiment 3, the n-well 6 has a depth of about 3 $\mu$m and is formed in the epitaxial layer 2E. The ion implantation impurity concentration (dose) for forming that n-well 6 is at about $1\times10^{13}$ atoms/cm². The subsequent steps are similar to those of the aforementioned present embodiment 1 so that their description will be omitted.

Thus, in the present embodiment 3, the following effects can be achieved in addition to those of the aforementioned embodiment 1.

Specifically, since the p⁺-type semiconductor region 2B is formed in the p⁻-type semiconductor substrate body 2S, the resistance at the side of the substrate surface can be drastically lowered to improve the resistance of the CMOS circuit to the latchup. As a result, it is possible to further improve the performance, reliability and production yield of the semiconductor integrated circuit device.

(Embodiment 4)

Figure 16:
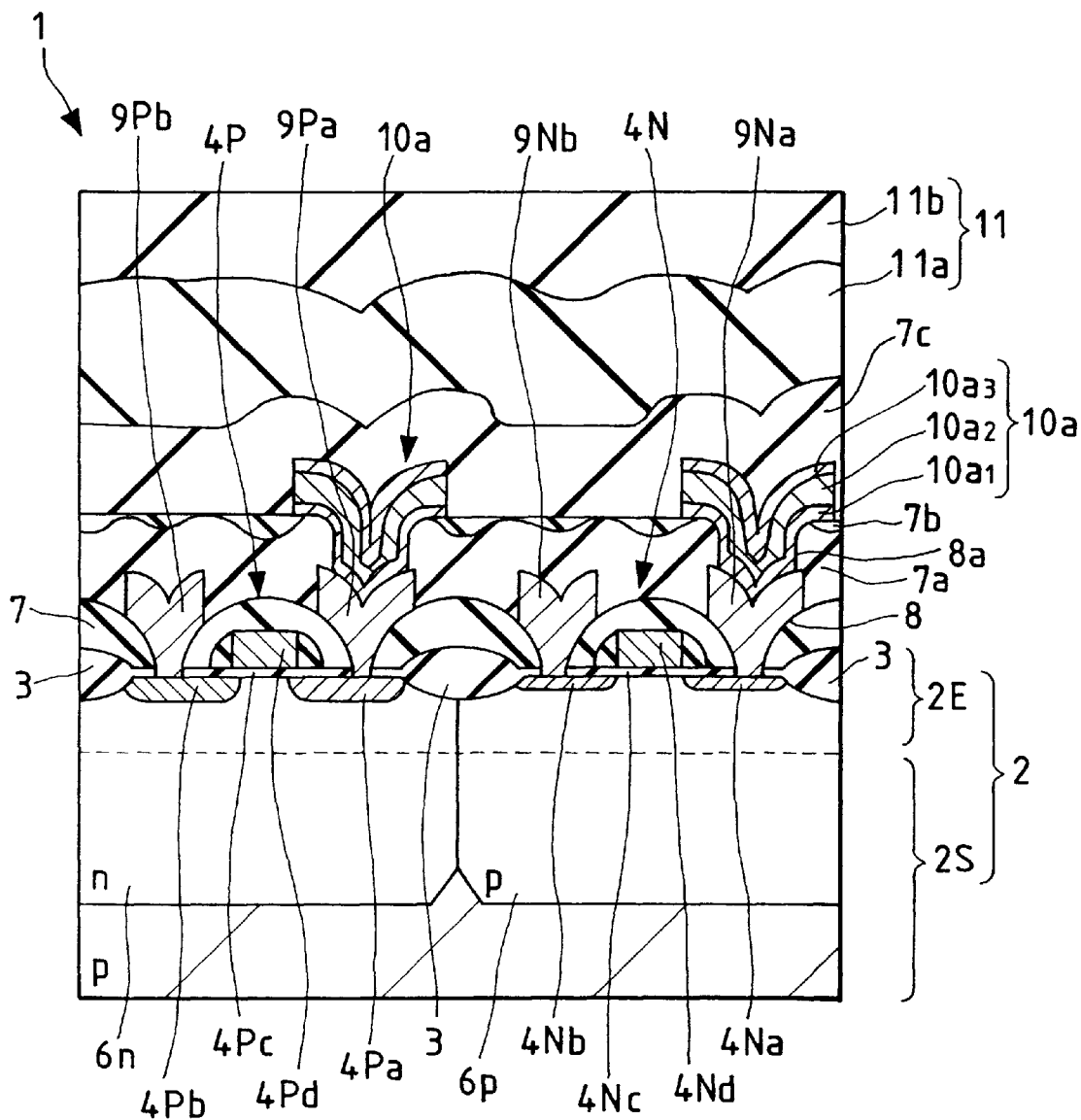
FIG. 16 is a section showing an essential portion of a semiconductor integrated circuit device according to another embodiment of the present invention.
Figure 17:
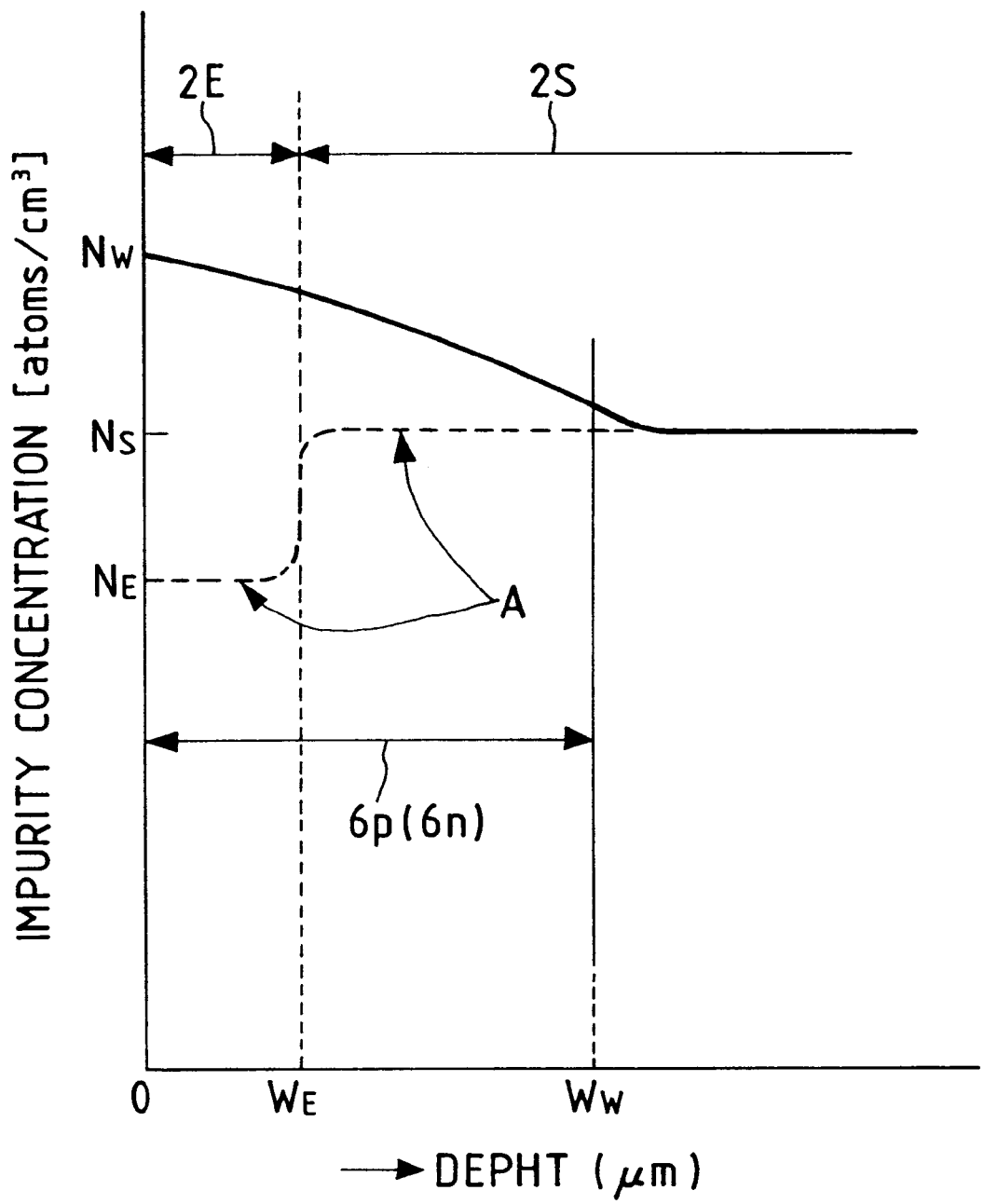
FIG. 17 is an impurity distribution diagram in the semiconductor integrated circuit device of FIG. 16 and has an abscissa indicating the depth from the surface of an epitaxial layer 2E and an ordinate indicating an impurity concentration.
Figure 18:
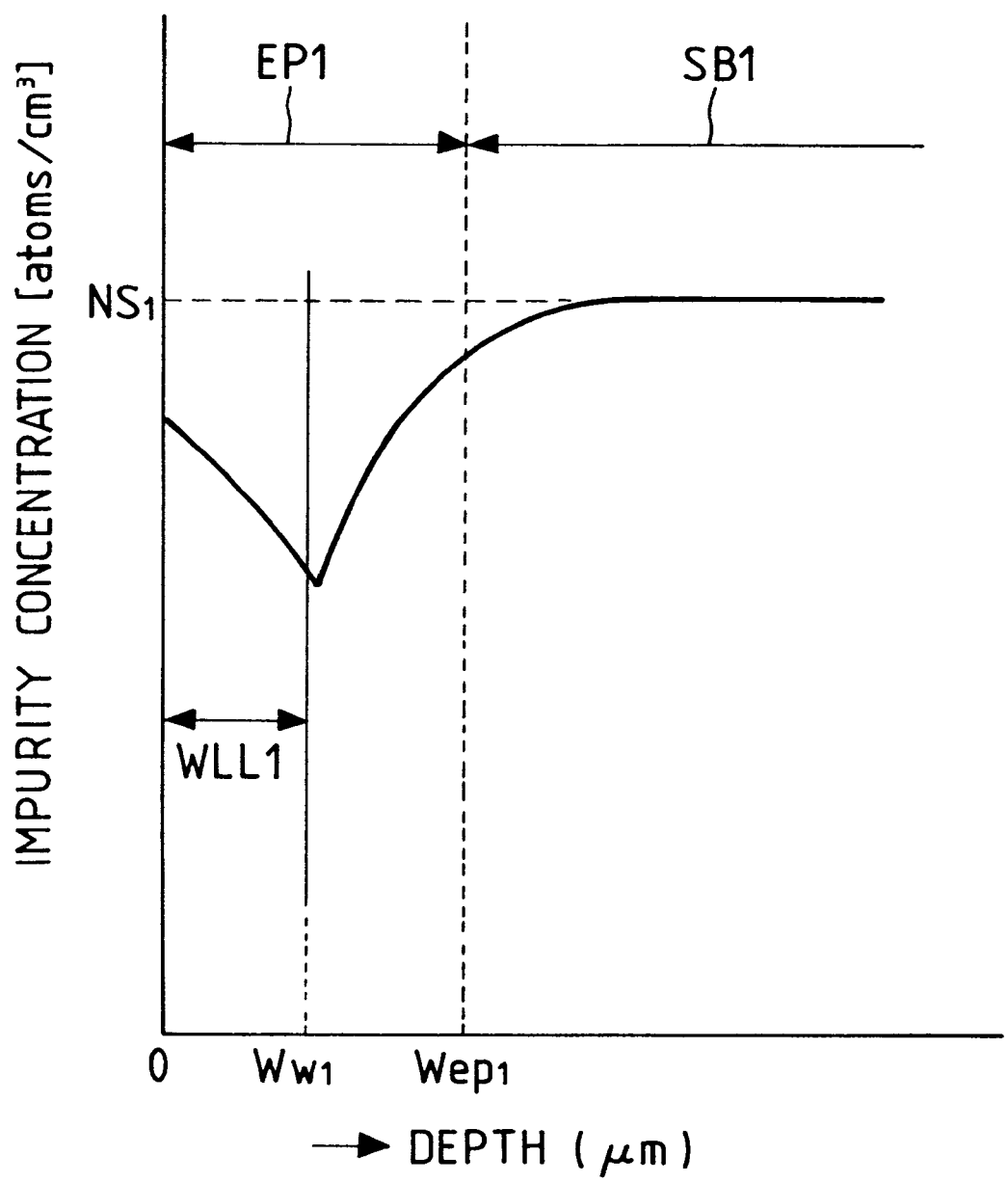
FIG. 18 is an impurity distribution diagram in the semiconductor integrated circuit device, as has been described in the prior art and has an abscissa indicating the depth from the surface of an epitaxial layer EP1 and an ordinate indicating an impurity concentration.
Figure 19:
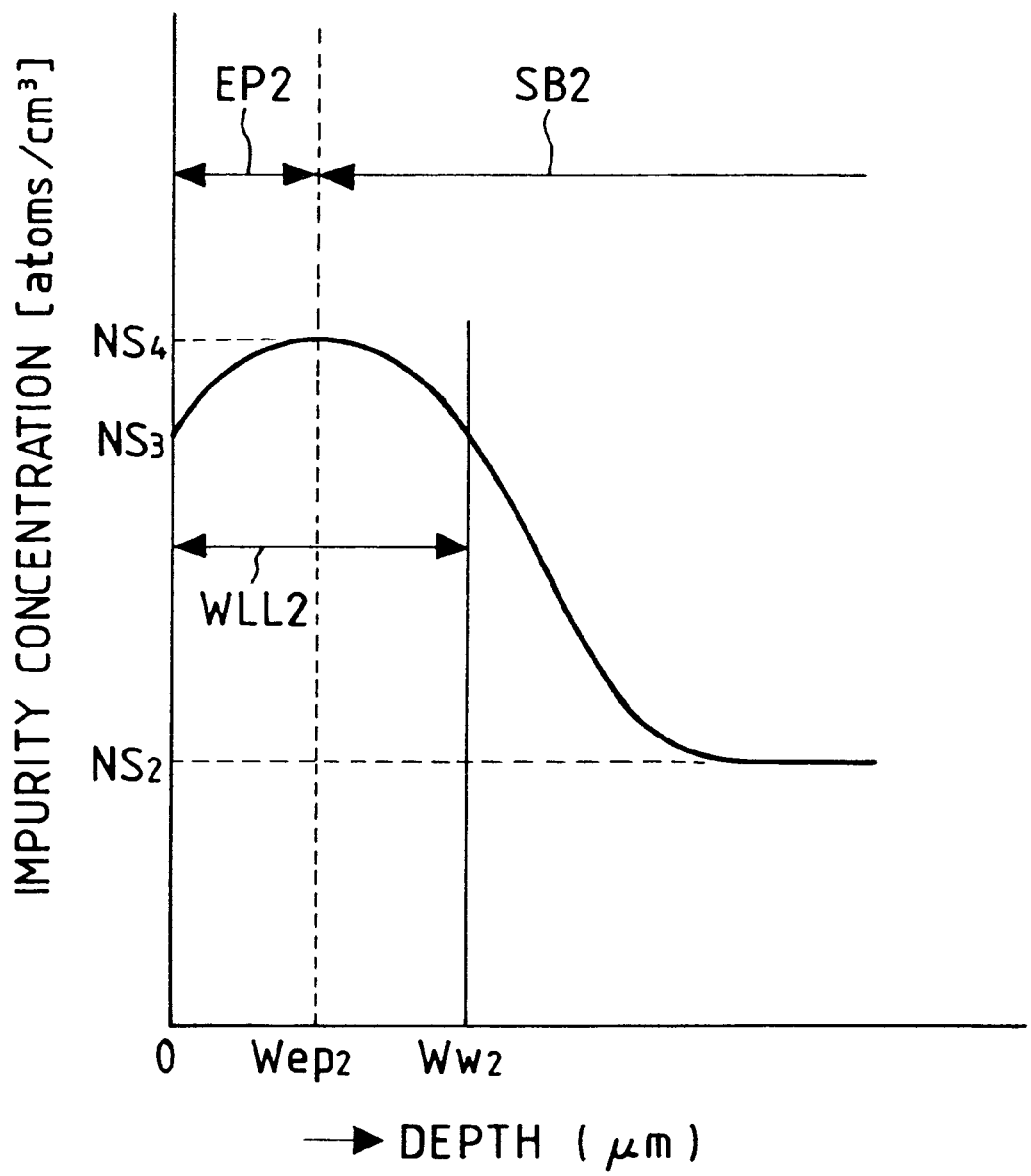
FIG. 19 is an impurity distribution diagram in the semiconductor integrated circuit device, as has been described in the prior art and has an abscissa indicating the depth from the surface of an epitaxial layer EP2 and an ordinate indicating an impurity concentration.

FIG. 16 is a section showing an essential portion of a semiconductor integrated circuit device according to another embodiment of the present invention; FIG. 17 is an impurity distribution diagram in the semiconductor integrated circuit device of FIG. 16; FIGS. 18 and 19 are impurity distribution diagrams in the semiconductor integrated circuit device having been described in the prior art; FIGS. 20 to 24 are sections showing an essential portion in the steps of manufacturing the semiconductor integrated circuit device; and FIG. 25 is a graph for explaining the effects of the semiconductor integrated circuit device of the present embodiment. Incidentally, the portions identical to those of the foregoing embodiment 1 are designated at the common reference characters.

As shown in FIG. 16, the relatively lightly doped semiconductor substrate body 2S of the semiconductor integrated circuit device 1 of the present embodiment 4 is made of a p-type Si single crystal or the like, for example. The semiconductor substrate body 2S is doped with a p-type impurity such as boron in a concentration of about $1.5 \times 10^{15}$ atoms/cm$^3$.

The epitaxial layer 2E made of a p$^-$-type Si single crystal or the like is formed over a principal surface of the semiconductor substrate body 2S. The epitaxial layer 2E is doped with a p-type impurity such as boron in a concentration lower than the designed one of the semiconductor substrate body 2S.

Thus, in the present embodiment 4, the p$^-$-type epitaxial layer 2E is formed over the p-type semiconductor substrate body 2S as in the foregoing embodiment 1 so that the expensive p$^+$-type semiconductor substrate body need not be used, and then the cost for the semiconductor substrate 2 is lowered to about one half.

Since, moreover, the impurity concentration of the semiconductor substrate body 2S is made higher than that of the epitaxial layer 2E, the resistance of the semiconductor substrate body 2S can be made lower than that of the epitaxial layer 2E to improve the resistance to the latchup.

As will be later shown in FIG. 17, the epitaxial layer 2E has a thickness $W_E$ (from the surface of the epitaxial layer 2E) similar to that of the foregoing embodiment 1, as exemplified by about 1 μm. As a result, it is possible to achieve the same effects as those described in connection with the foregoing embodiment 1. The upper and lower limits of the thickness of the epitaxial layer 2E are similar to those of the foregoing embodiment 1.

The semiconductor substrate 2 is formed in its upper portion with a p-well (i.e., the first semiconductor region) 6p and an n-well (i.e., the first semiconductor region) 6n. The p-well 6p is doped with a p-type impurity such as boron. The p-well 6p is formed with the nMOS 4N. On the other hand, the n-well 6n is doped with an n-type impurity such as phosphor. The n-well 6n is formed with the pMOS 4P. As will be later shown in FIG. 17, the depth $W_W$ (i.e., the depth from the surface of the epitaxial layer 2E) of the n-well 6n and the p-well 6p is larger than the thickness $W_E$ of the epitaxial layer 2E.

Incidentally, the CMOS circuit is constructed of the nMOS 4N and the pMOS 4P, which have their structures, materials and effects similar to those of the foregoing embodiment 1. On the other hand, the structures of the nMOS 4N and the pMOS 4P may be changed to the double drain (or double diffused drain) structure and the LDD (i.e., Lightly Doped Drain) structure.

On the insulating film 7, there is deposited an insulating film 7a of SiO$_2$, for example, on which is deposited a flattening insulating film 7b. The insulating films 7, 7a and 7b are formed with connection holes 8a extending to reach the electrodes 9Nb and 9Pb, through which a second-layer wiring line 10a is electrically connected with the electrodes 9Na and 9Pa.

The second-layer wiring line 10a is formed by depositing a barrier layer 10a1 of titanium nitride (TiN), a conductor layer 10a2 of an Al—Si—Cu alloy and a barrier layer 10a3 of titanium nitride sequentially from the lower layer.

An insulating film 7c of SiO$_2$, for example, is deposited on the insulating film 7b to cover the second-layer wiring line 10a. On the insulating film 7c, there is deposited the surface protecting film 11. This surface protecting film 11 is formed by depositing an insulating film 11a of SiO$_2$ and an insulating film 11b of Si$_3$N$_4$, for example, sequentially from the lower layer.

Incidentally, in the present embodiment 4, the aforementioned p-well 6p and n-well 6n are formed to extend from the surface of the epitaxial layer 2E to the upper portion of the semiconductor substrate body 2S, as shown in FIGS. 16 and 17, and the p-well 6p and n-well 6n have their impurity concentrations gradually lowered in the depthwise direction from the principal surface (having an impurity concentration $N_W$) of the epitaxial layer 2E. Thus, the impurity concentration of the p-well 6p is given such a gradient that it is gradually lowered in the depthwise direction from the surface of the epitaxial layer 2E, so that the influence to be caused by the carriers (or electrons) due to the α-ray is lowered. Specifically, the electrons produced by the α-ray are attracted to the substrate body 2S by that concentration gradient and prevented from entering the p-well 6p so that the soft errors can be reduced in case the MIS memory of the DRAM or the like is formed in the p-well 6p. The impurity concentration $N_W$ in the principal surface of the epitaxial layer 2E of the p-well 6p and the n-well 6n is at about $6 \times 10^{16}$ atoms/cm$^3$, so that the impurity concentration of the p-well 6p and the n-well 6n is at $5 \times 10^{15}$ to $6 \times 10^{16}$ atoms/cm$^3$.

In FIG. 17, letter A plots the impurity concentration distributions of the epitaxial layer 2E and semiconductor substrate body 2S in the epitaxial wafer state, and indicates that the impurity concentration ($N_E$) of the epitaxial layer 2E is lower than that ($N_S$) of the semiconductor substrate body 2S, as described above. Thus, the p-well 6p is formed after the p$^-$-type epitaxial layer 2E is formed over the p-type semiconductor substrate body 2S, the well concentration (i.e., the concentration $N_W$ of the well surface) of the p-well 6p is not influenced by the p-type impurity concentration of the semiconductor substrate body 2S. Specifically, since the p$^-$-type epitaxial layer 2E is formed over the semiconductor substrate body 2S, the well concentration $N_W$ of the p-well 6p is not influenced by the dispersion of the p-type impurity concentration of the semiconductor substrate body 2S so that the fluctuation of the Vth of the MIS.FET is not caused by that dispersion. As a result, the allowable concentration range can be widened more than the prior art with respect to the dispersion of the p-type impurity concentration of the semiconductor substrate body 2S so that the cost for the semiconductor integrated circuit device can be lowered. In other words, in the prior art, only a narrow range can be used as the p-type impurity concentration of the semiconductor substrate body 2S to raise the cost for the semiconductor integrated circuit device.

For comparisons, the impurity concentration distributions of the aforementioned two cases of the prior art are plotted in FIGS. 18 and 19. Incidentally, FIG. 18 corresponds to the case of the aforementioned technique, as described on pp. 761 to 763 of "Applied Physics, Vol. 60, No. 8", issued on Aug. 10, 1991, by Japanese Association of Applied Physics, and FIG. 19 corresponds to the case of the aforementioned technique, as described in the Japanese Patent Laid-Open No. 260832/1989.

In the technique shown in FIG. 18, the impurity concentration NS$_1$ of the semiconductor substrate body SB1 is higher than that of the epitaxial layer EP1. Moreover, the well WLL1 is formed in the epitaxial layer from the standpoint of setting the impurity concentration. This makes it necessary to make the epitaxial layer deeper, as at Wep1, than the well WLL1. In short, the thickness Wep1 of the epitaxial layer has to be larger than the depth of the well WLL1. Moreover, the well WLL1 of this case is formed by implanting the epitaxial layer EP1 with the impurity from the surface thereof, so that the impurity concentration is higher in the substrate surface than in the inside.

In the technique shown in FIG. 19, the impurity concentrations of both the semiconductor substrate body SB2 and the epitaxial layer EP2 are set to be low, as at $NS_2$. The diffusion layer WLL2 is formed to extend deeper, as at $W_{W2}$, than the depth Wep2 of the epitaxial layer EP2. The diffusion layer WLL2 of this case is formed by the diffusion (i.e., the diffusion of the impurity of the semiconductor substrate body SB2 from the semiconductor substrate body to the epitaxial layer EP2) at the time when the epitaxial layer EP2 is formed over the semiconductor substrate body SB2 which has been doped in its upper portion with a diffusion layer forming impurity. As a result, the impurity concentration is low, as at $NS_3$, in the substrate surface but high, as at $NS_4$, in the boundary region between the epitaxial layer EP2 and the semiconductor substrate body SB2 and gets lower internally of the semiconductor substrate body.

With reference to FIGS. 20 to 24, here will be described the process for manufacturing the semiconductor integrated circuit device of the present embodiment 4.

Figure 20:
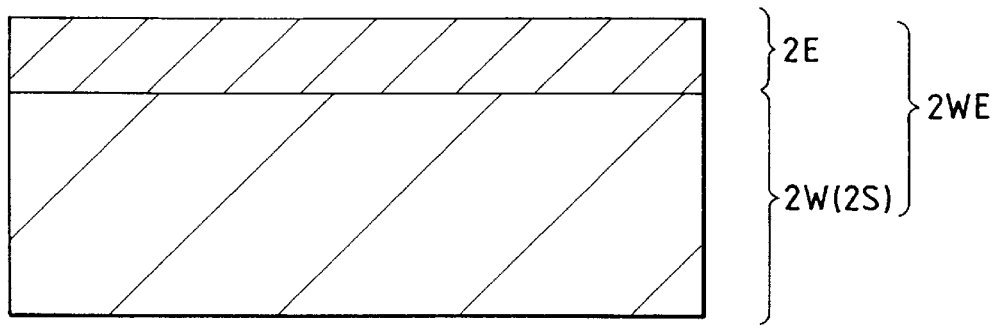
FIG. 20 is a section showing an essential portion of a semiconductor substrate at a step of manufacturing the semiconductor integrated circuit device of FIG. 16.
Figure 21:
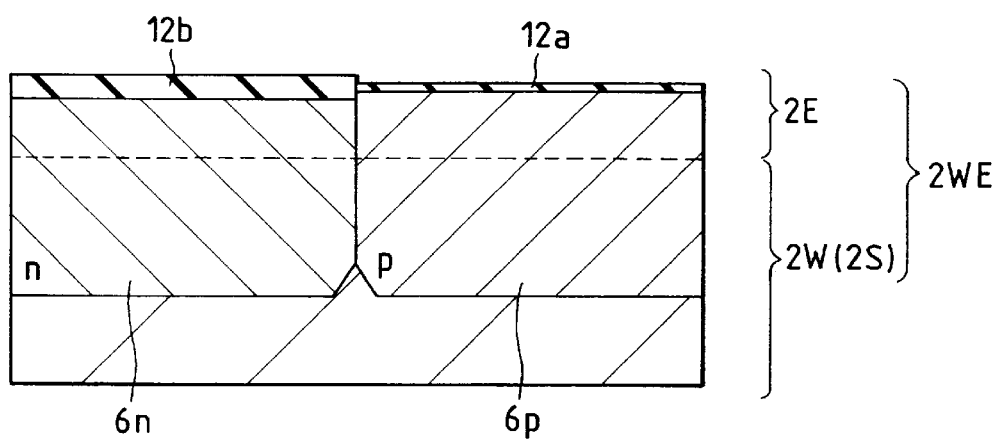
FIG. 21 is a section showing an essential portion of the semiconductor substrate at the step, as subsequent to FIG. 20, of manufacturing the semiconductor integrated circuit device of FIG. 16.

First of all, as shown in FIG. 20, the mirror wafer 2W or the mother material of the semiconductor substrate body 2S made of a p-type Si single crystal is formed over its mirror surface with the epitaxial layer 2E, which is made of an Si single crystal having the same conduction type as the mirror wafer 2W and containing an impurity of a lower concentration than that of the mirror wafer 2W, by the CVD method using $SiH_4$ gas and $H_2$ gas similar to those of the foregoing embodiment 1.

Here, the mirror wafer 2W has an impurity concentration of about $1.5 \times 10^{15}$ atoms/cm$^3$. Moreover, the epitaxial layer 2E has a thickness $W_E$ of about 1 µm, for example.

Subsequently, the mirror wafer 2W is formed in its predetermined region with an insulating film 12a made of $SiO_2$ having a thickness of about 40 nm. After this, a (not-shown) insulating film made of $Si_3N_4$ having a thickness of about 50 nm, for example, is deposited on a predetermined region of the mirror wafer 2W by the CVD method or the like.

After this, the film portion in the n-well forming region is removed from the insulating film of $Si_3N_4$ by the dry etching method or the like. After this, the film portion and the resist film of the p-well forming region in the insulating film of $Si_3N_4$ is used as a mask to dope the exposed portion of the epitaxial layer 2E with the ions of an n-type impurity such as phosphor for forming the n-well. The ion implanting energy at this time is at about 125 KeV, and the dose is about $2 \times 10^{13}$ atoms/cm$^2$.

After this, the film portion, as in the p-well forming region, of the insulating film of $Si_3N_4$ is used as a mask to form an insulating film 12b having a thickness of about 120 nm over the epitaxial layer 2E at the n-well side. After this, the insulating film over the n-well forming region is used as an ion implantation mask to dope the exposed portion of the epitaxial layer 2E with a p-type impurity such as boron for forming the p-well, for example. The ion implantation energy at this time is about 60 KeV, and the dose is about $8 \times 10^{12}$ atoms/cm$^2$, for example.

Next, the mirror wafer 2W is subjected to an annealing treatment for extended diffusion for 3 hours, for example, to form the p-well 6p and the n-well 6n having a depth of about 3 µm, for example. The treatment temperature at this time is about 1,200° C., for example.

In the present embodiment 4, at this annealing treatment, the p-well 6p and the n-well 6n are extended from the surface of the epitaxial layer 2E to the upper portion of the mirror wafer 2W and made to have their impurity concentrations gradually lowered depthwise from the surface of the epitaxial layer 2E. The impurity concentration of the p-well 6p and the n-well 6n is at $5 \times 10^{15}$ to $6 \times 10^{16}$ atoms/cm$^3$.

Figure 22:
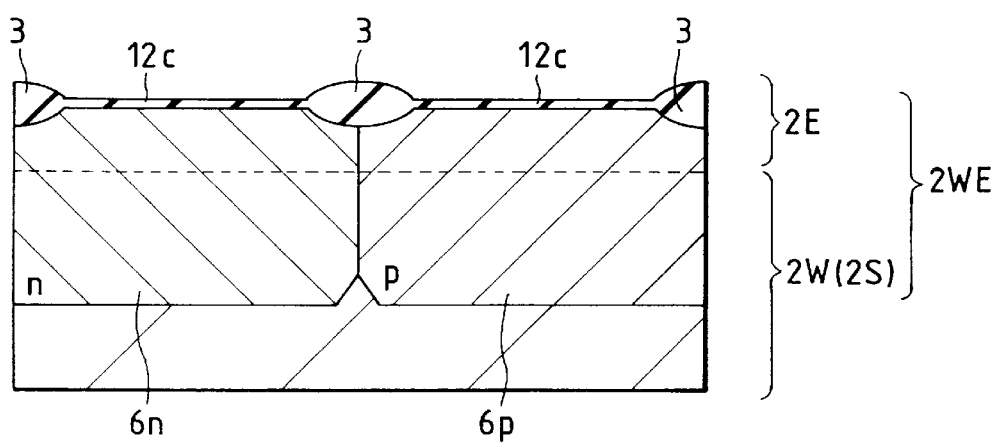
FIG. 22 is a section showing an essential portion of the semiconductor substrate at the step, as subsequent to FIG. 21, of manufacturing the semiconductor integrated circuit device of FIG. 16.

Subsequently, as shown in FIG. 22, a pad oxide film 12c and the (not-shown) non-oxidizable insulating film of $Si_3N_4$ are deposited sequentially from the lower layer. After this, the non-oxidizable insulating film is removed from the element separating region but left at the element forming region.

Figure 23:
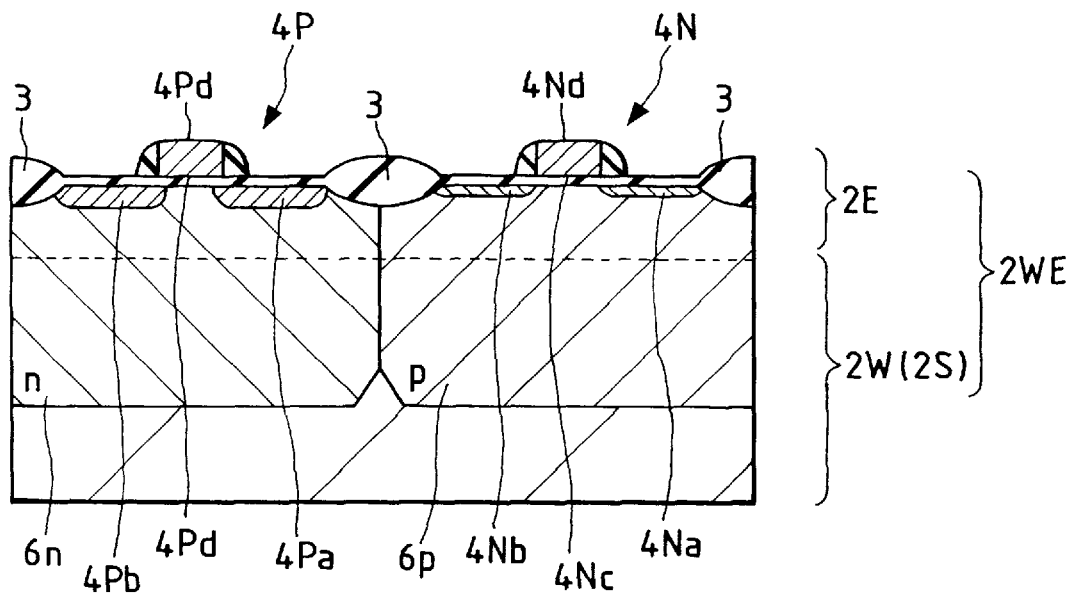
FIG. 23 is a section showing an essential portion of the semiconductor substrate at the step, as subsequent to FIG. 22, of manufacturing the semiconductor integrated circuit device of FIG. 16.

After this, the non-oxidizable insulating film left unremoved is used as a mask to form the field insulating film 3 selectively in the element separating region. After this, as shown in FIG. 23, the element forming region, as enclosed by the field insulating film 3, is formed by the thermal oxidation method with the gate insulating films 4Nc and 4Pc made of $SiO_2$ having a thickness of about 180 angstroms, for example.

Thus in the present embodiment 4, too, the gate insulating films 4Nc and 4Pc are given an excellent film quality by forming them over the epitaxial layer 2E so that their breakdown voltages can be improved. Moreover, the gate insulating films 4Nc and 4Pc can have their defect densities improved by one figure or more.

Subsequently, the gate insulating films 4Nc and 4Pc are simultaneously formed thereover with the gate electrodes 4Nd and 4Pd made of an n-type poly-silicon of low resistance, for example. After this, these gate electrodes 4Nd and Pd are used as masks to form the paired semiconductor regions 4Na and 4Nb and the paired semiconductor regions 4Pa and 4Pb by the separate ion implantation steps thereby to form the nMOS 4N and pMOS 4P over the epitaxial wafer 2WE.

Here, the gate electrodes 4Nd and 4Pd should not be limited to those made of elemental poly-silicon but can be modified in various manners. For example, the gate electrodes 4Nd and 4Pd may be given the so-called "poly-cide structure", in which a refractory metal silicide film is deposited on poly-silicon of low resistance.

Moreover, the semiconductor region 4Na of the nMOS 4N is formed by doping it with ions of As in a dose of about $1 \times 10^{15}$ atoms/cm$^2$, for example. On the other hand, the semiconductor region 4Pa of the pMOS 4P is formed by doping it with ions of $BF_2$ in a dose of about $1 \times 10^{15}$ atoms/cm$^2$, for example.

Incidentally, the semiconductor regions 4Na, 4Nb, 4Pa and 4Pb may be exemplified by the double diffused drain structure or the LDD structure, as described above.

Figure 24:
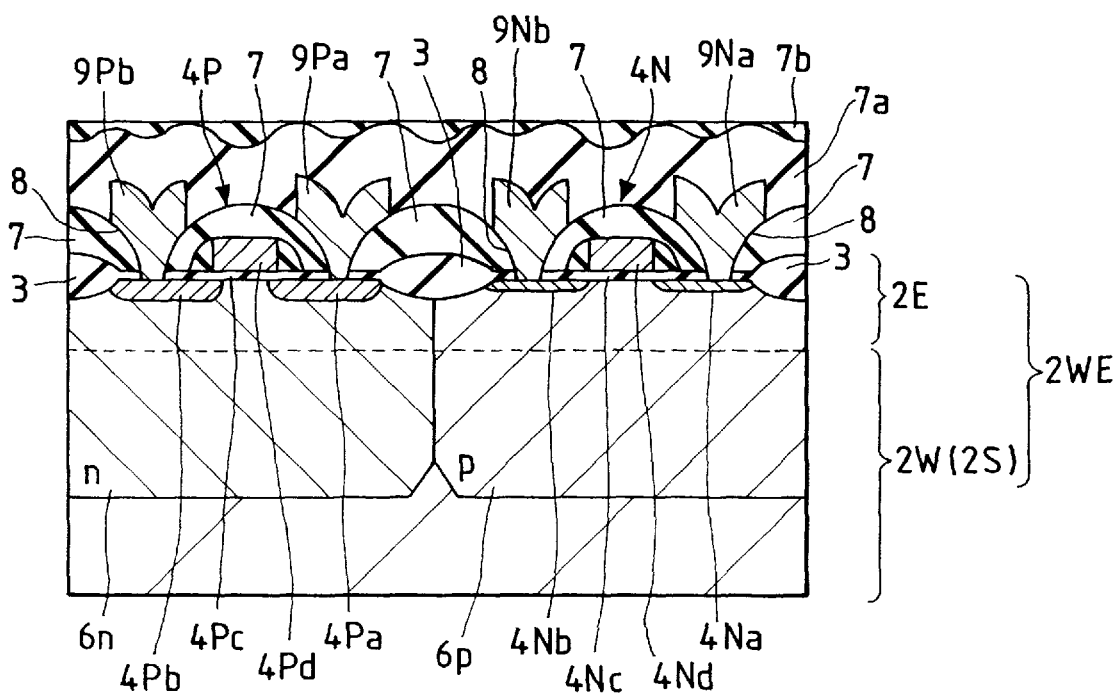
FIG. 24 is a section showing an essential portion of the semiconductor substrate at the step, as subsequent to FIG. 23, of manufacturing the semiconductor integrated circuit device of FIG. 16.

After this, as shown in FIG. 24, the insulating film 7 of $SiO_2$ is deposited on the epitaxial wafer 2WE by the CVD method or the like. This insulating film 7 is mainly composed of the BPSG (i.e., Boro Phospho Silicate Glass) containing $B_2O_3$ and $P_2O_5$.

Next, the insulating film 7 is formed with the connection holes 8 for exposing the semiconductor regions 4Na and 4Nb of the nMOS 4N and the semiconductor regions 4Pa and 4Pb of the pMOS 4P to the outside. After this, the conductor film 9 of the Al—Si—Cu alloy, for example, is deposited on the epitaxial wafer 2WE by the sputtering method or the evaporation method.

Subsequently, the conductor film 9 is patterned by the dry etching method or the like to form the electrodes 9Na, 9Nb, 9Pa, 9Pb, 9Sa and 9Sb. After this, the insulating film 7a of $SiO_2$, for example, is deposited on the epitaxial wafer 2WE by the CVD method of the like. After this, the flattening insulating film 7b of $SiO_2$ is deposited on the insulating film 7a by the CVD method or the like.

Next, the flattening insulating film 7b is flattened by the CMP (i.e., Chemical Mechanical Polishing) method or the like. After this, the insulating films 7, 7a and 7b are formed with the connection holes 8a by the dry etching method, as shown in FIG. 16.

Subsequently, the barrier layer 10a1 of TiN, the conductor layer 10a2 of the Al—Si—Cu alloy and the barrier layer 10a3 of TiN, for example, are deposited on the epitaxial wafer 2WE sequentially from the lower layer by the sputtering method or the evaporation method.

Subsequently, those barrier layers 10a1 and 10a3 and conductor layer 10a2 are patterned by the dry etching method or the like to form the second-layer wiring line 10a. After this, the insulating film 7c of $SiO_2$, for example, is deposited on the epitaxial wafer 2WE by the CVD method or the like.

After this, the insulating film 11a of $SiO_2$ is deposited on the insulating film 7c by the CVD method or the like. The insulating film 11b of $Si_3N_4$ is then deposited on the insulating film 11a by the CVD method or the like to from the surface protecting film 11.

After this, the individual semiconductor chips are divided from the epitaxial wafer 2WE to manufacture the semiconductor integrated circuit device 1, as shown in FIG. 16.

Figure 25:
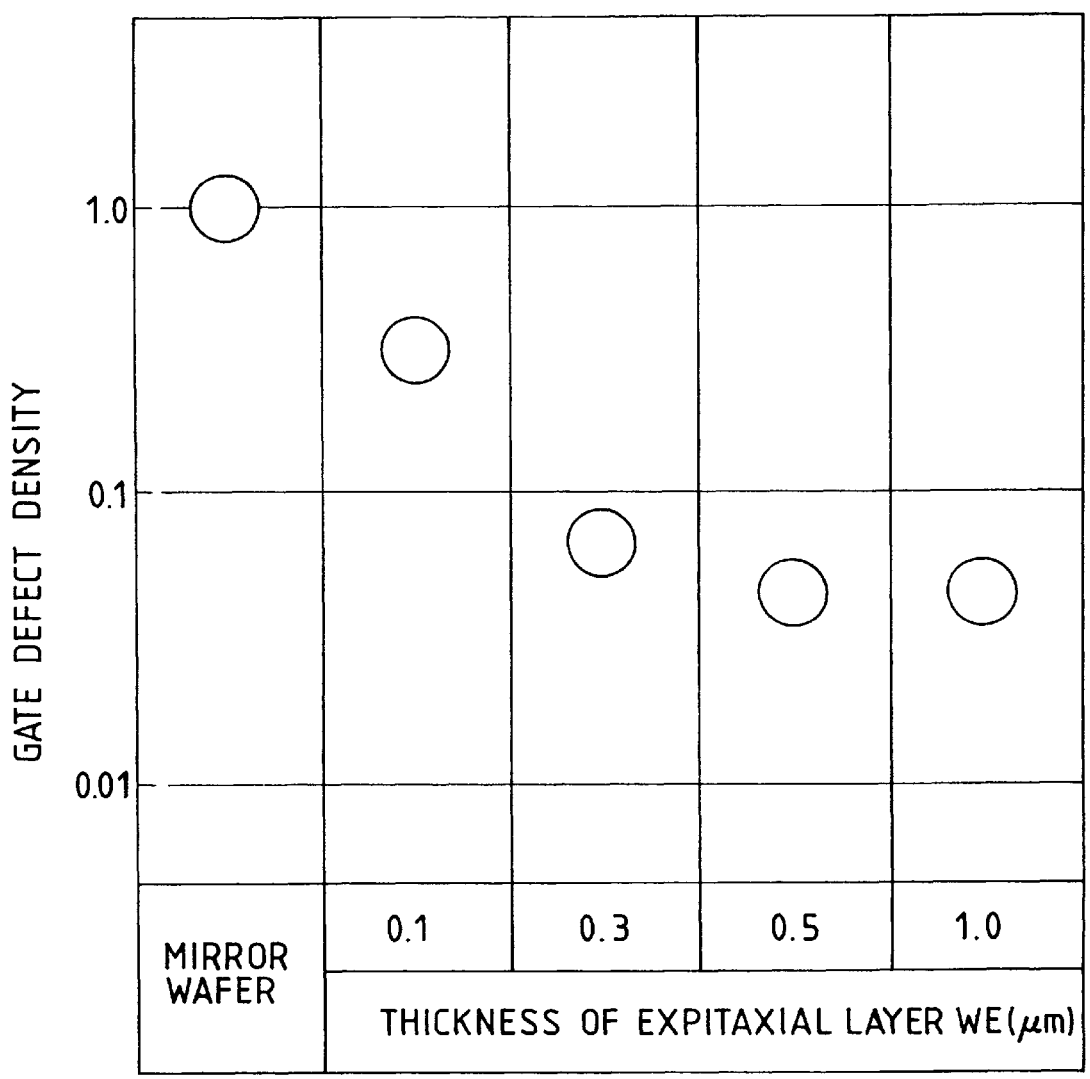
FIG. 25 is a graph diagram for explaining the effects of the semiconductor integrated circuit device of the present embodiment.

Here, in case the structure of the present embodiment 4 is applied to a 4 M.DRAM (i.e., 4 Megabit Dynamic RAM), the results of the performances (e.g., the gate breakdown voltage) of the gate insulating film are plotted in FIG. 25.

FIG. 25 plots the performances of the gate insulating film in case the MOS capacitor to have its gate breakdown voltage evaluated is prepared after the process for manufacturing the 4 M.DRAM is executed to the step of forming the gate insulating film.

It is assumed here that: the gate insulating film has a thickness of about 18 nm; the gate electrode has an area of about 4.8 mm$^2$; and the gate electrode is made of phosphor-doped poly-silicon.

The abscissa indicates the thickness $W_E$ of the epitaxial layer. On the other hand, the ordinate indicates the defect density which is calculated from the following equation by measuring the breakdown characteristics of about two hundreds of MOS capacitors on the semiconductor wafer (or the epitaxial wafer) and then by deciding the non-defective and defective produces according to the following standards. However, the densities are generally indicated in relative values with reference to the mirror wafer for the MOS.LSI having no epitaxial layer.

Standards for Deciding Products Non-Defective in Breakdown Voltage: Electric Field>10 MV/cm. Here, the electric current is at about 1 mA. For a gate defect density D, the number P of the capacitors measured, and the number N of the defective capacitors, $D=(100/4.8)\ln((P-N)/P)$.

Thanks to the structure of the present embodiment 4, as seen from FIG. 25, it can be confirmed that the defect density can be reduced more by one figure or more than the case, in which the gate insulating film is formed over the mirror wafer, to provide an excellent gate breakdown performance.

As has been described hereinbefore, according to the present embodiment 4, the following effects can be achieved in addition to those of the foregoing embodiment 1.

(1) For manufacturing the semiconductor integrated circuit device, there can be used absolutely the same process as that of the case in which the CMOS circuit is to be formed over. the mirror wafer. As a result, the semiconductor integrated circuit device having the CMOS circuit over the epitaxial wafer 2WE can be formed without any change in the design or in the manufacture process.

(2) Since the impurity concentration of the epitaxial layer 2E is made lower than that of the semiconductor substrate body 2S, the resistance of the semiconductor substrate body 2S can be made lower than that of the epitaxial layer 2E to improve the resistance to the latchup.

(Embodiment 5)

FIG. 26(A) is a section showing an essential portion of a semiconductor integrated circuit device according to another embodiment of the present invention.

Figure 26B:
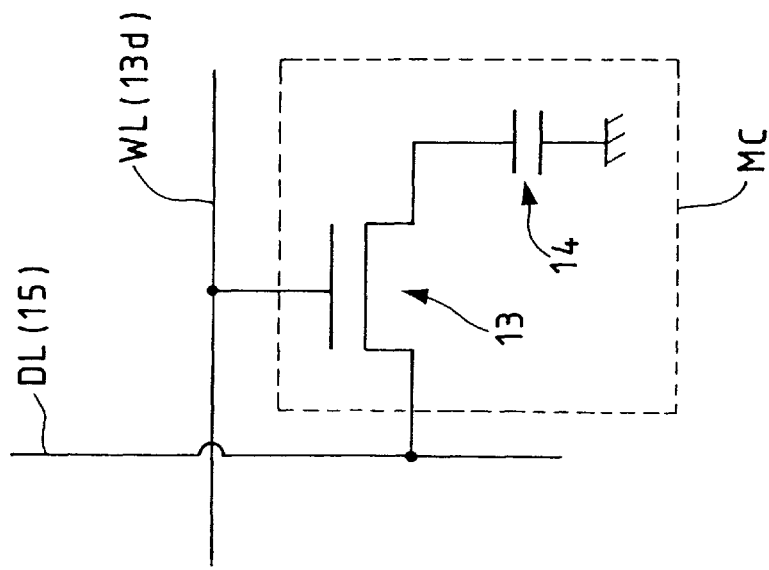
FIG. 26(B) is a circuit diagram showing a memory cell of the semiconductor integrated circuit device of FIG. 26(A)

The semiconductor integrated circuit device 1 of the present embodiment 5, as shown in FIG. 26(A), is exemplified by a 16 M.DRAM. FIG. 26(B) is a circuit diagram showing a memory cell of the DRAM. In FIG. 26(A), the lefthand side shows a memory cell region, and the righthand side shows a peripheral circuit region. Incidentally, this peripheral circuit region has the same structure as that of the foregoing embodiment 4, and its description will be omitted.

In the present embodiment 5, too, the impurity concentration of the epitaxial layer 2E is made lower than that of the semiconductor substrate body 2S, as in the foregoing embodiment 4.

As shown in FIGS. 26(A) and 26(B), one memory cell MC is constructed by one transfer MOS. FET 13 and one capacitor 14.

The transfer MOS.FET 13 is composed of a pair of semiconductor regions 13a and 13b formed in a p-well 6p1, a gate insulating film 13c formed over the epitaxial layer 2E, and a gate electrode 13d formed over the gate insulating film 13c.

Here in the memory cell region, too, the p-well 6p1 is formed to extend from the surface of the epitaxial layer 2E to the upper portion of the semiconductor substrate body 2S, as located deeper than the epitaxial layer 2E. Moreover, the impurity concentration of the p-well 6p1 is made gradually lower, as in the foregoing embodiment 4, depthwise of the semiconductor substrate 2.

The paired semiconductor regions 13a and 13b are doped with an n-type impurity such as As. In the present embodiment 5, these semiconductor regions 13a and 13b are formed in the epitaxial layer 2E having less defects due to the precipitation of oxygen, so that the junction leakage current can be reduced to improve the performance, reliability and production yield of the DRAM.

With one semiconductor region 13a, there is electrically connected a bit line (BL) 15. This bit line 15 is composed, for example, of a conductor layer 15a made of polycrystalline silicon of low resistance and a conductor layer 15b formed over the former and made of tungsten silicide or the like.

With the other semiconductor region 13b, on the other hand, there is electrically connected a lower electrode 14a of the capacitor 14. In the present embodiment 5, the semiconductor region 13b is formed in the epitaxial layer 2E having less defects due to the precipitation of oxygen, so that the leakage of the charge accumulated in the capacitor 14 can be suppressed to elongate the charge storage time period thereby to improve the refresh characteristics.

The capacitor 14 is formed into a fin shape and constructed of the lower electrode 14a, an upper electrode 14b, and a (not-shown) insulating film interposed between those electrodes. However, the shape of the capacitor should not be limited to the fin but can be modified in various manners such as a cylindrical shape.

Incidentally, the gate electrode 13d of the transfer MOS. FET 13 also acts as the word line (WL). Moreover, reference numerals 16a and 16b appearing in FIG. 26(A) designate channel stopper regions.

Thus in the present embodiment 5, the following effects can be achieved in addition to those of the foregoing embodiment 1.

Specifically, since the semiconductor region 13b to be electrically connected with the lower electrode 14a of the capacitor 14 is formed in the epitaxial layer 2E, the leakage of the charge accumulated in the capacitor 14 can be suppressed to elongate the charge storage time period thereby to improve the refresh level. As a result, it is possible to improve the performance, reliability and production yield of the DRAM.

(Embodiment 6)

FIG. 27(A) is a section showing an essential portion of a semiconductor integrated circuit device according to another embodiment of the present invention.

Figure 27B:
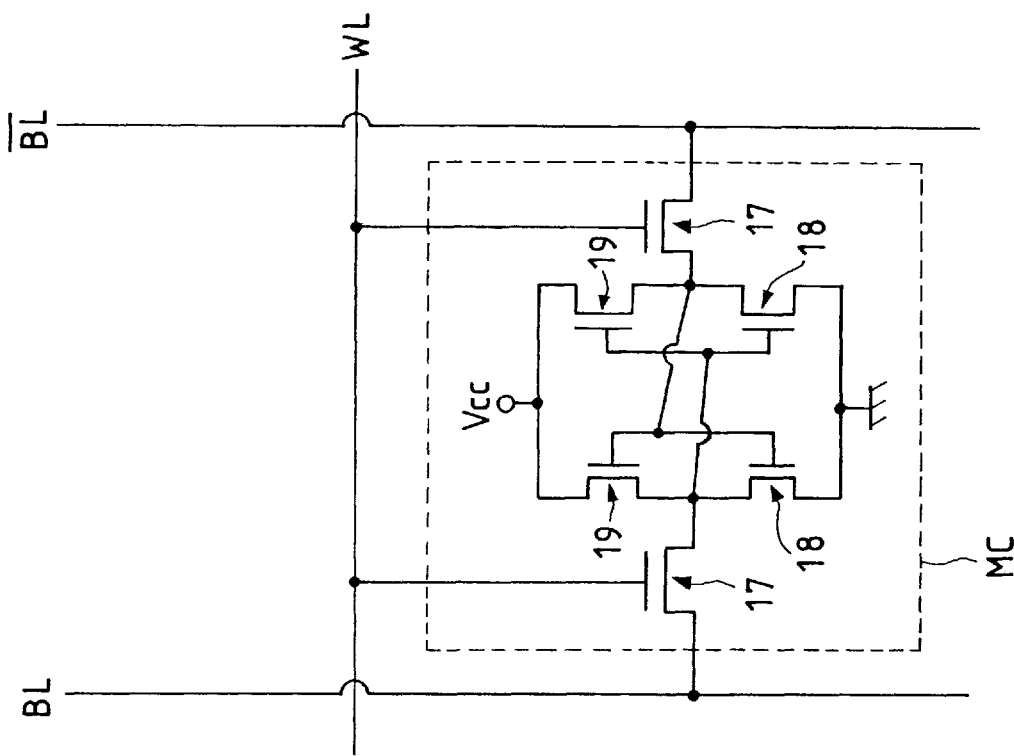
FIG. 27(B) is a circuit diagram showing a memory cell of the semiconductor integrated circuit device of FIG. 27(A)

The semiconductor integrated circuit device 1 of the present embodiment 6, as shown in FIG. 27(A), is exemplified by a 4 M-SRAM (i.e., 4 Megabit Static RAM). In the present embodiment 6, too, the impurity concentration of the epitaxial layer 2E is made lower than that of the semiconductor substrate body 2S, as in the foregoing embodiment 4. FIG. 27(B) is a circuit diagram showing a memory cell of the SRAM.

In the present embodiment 6, as shown in FIGS. 27(A) and 27(B), in the semiconductor substrate 2, the memory cell region is formed with a p-well 6p2, and the peripheral circuit region is formed with an n-well 6n1.

These p-well 6p2 and n-well 6n1 are formed, as in the foregoing embodiments 4 and 5, to extend from the surface of the epitaxial layer 2E to the upper portion of the semiconductor substrate body 2S. Moreover, their impurity concentrations are made gradually lower depthwise of the semiconductor substrate 2 as in the foregoing embodiment 4.

The memory cell region is formed with a transfer MOS. FET 17, a drive MOS.FET 18 and a load MOS. FET 19.

The transfer MOS.FET 17 is composed of: a pair of semiconductor regions 17a and 17b formed in the upper portion of the p-well 6p2; a gate insulating film 17c formed over the epitaxial layer 2E; and a gate electrode 17d formed over the gate insulating film 17c.

These semiconductor regions 17a and 17b are doped with an n-type impurity such as As. One semiconductor region 17a is electrically connected through the first-layer wiring line 10 with the bit line 15 (BL and $\overline{BL}$). The other semiconductor region 17b is electrically connected with a gate electrode 18d of the drive MOS.FET 18.

Incidentally, the transfer MOS.FET 17 and the drive MOS.FET 18 have their gate electrodes 17d and 18d formed by depositing a refractory metal silicide on the conductor film made of poly-silicon of low resistance, and the transfer MOS.FET 17 has its gate electrode 17d connected with the word line WL.

Moreover, the gate insulating films 17c and 18c are made of $SiO_2$, for example. Still moreover, the paired semiconductor regions of the drive MOS.FET 18 are positioned in the direction of the channel length of the gate electrode 18d, although not shown.

The load MOS.FET 19 is composed of a gate electrode 19a made of poly-silicon of low resistance, and a pair of semiconductor regions 19c and 19d formed over the gate electrode 19a through a gate insulating film 19b and made of poly-silicon of low resistance. The semiconductor regions 19c and 19d are doped with an n-type impurity such as As.

The peripheral circuit region is formed with the pMOS 4P, for example. This pMOS 4P is composed of: the paired semiconductor regions 4Pa and 4Pb formed in the upper portion of the n-well 6n1; the gate insulating film 4Pc formed over the epitaxial layer 2E; and the gate electrode 4Pd formed over the gate insulating film 4Pc. These semiconductor region 4Pa and 4Pb are doped with a p-type impurity such as boron.

In the present embodiment 6, the following effects can be achieved in addition to those of the foregoing embodiment 1.

Specifically, according to the structure of the present embodiment 6, the memory cell (MC) of the SRAM is formed over the epitaxial layer 2E having less defects due to the precipitation of oxygen so that the junction leakage current can be reduced in the paired semiconductor regions 17a and 17b of the transfer MOS.FET 17 and the (not-shown) paired semiconductor regions of the drive MOS.FET 18, as composing the memory cell (MC). As a result, the data storage retaining characteristics (e.g., the data retention level) can be improved to reduce the data retention fault percentage. As a result, it is possible to improve the performance, reliability and production yield of the SRAM.

(Embodiment 7)

Figure 28:
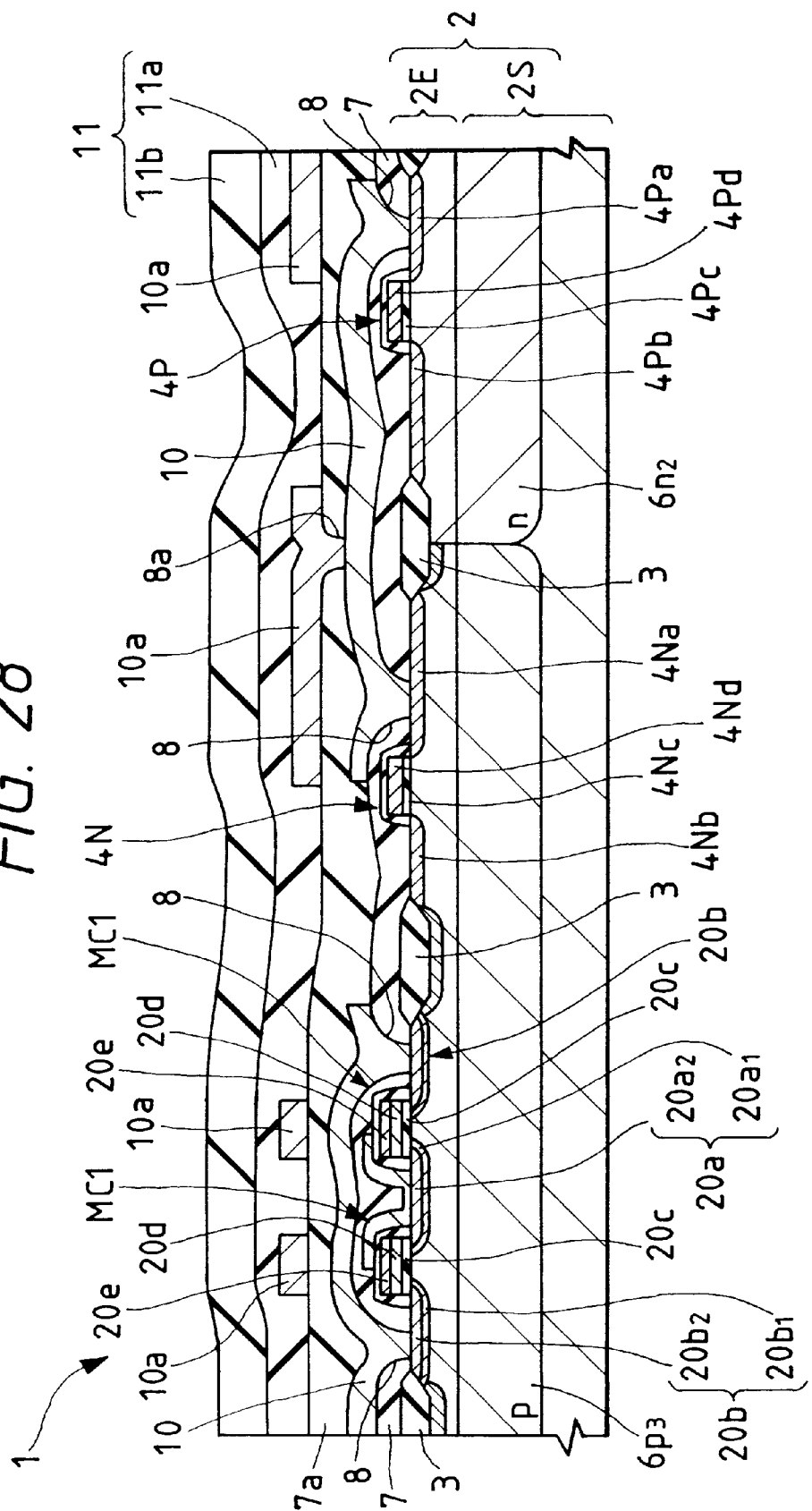
FIG. 28 is a section showing an essential portion of a semiconductor integrated circuit device according to another embodiment of the present invention.

FIG. 28 is a section showing an essential portion of a semiconductor integrated circuit device according to another embodiment of the present invention.

The semiconductor integrated circuit device 1 of the present embodiment 7, as shown in FIG. 28, is exemplified by a flash memory (i.e., flash EEPROM (Electrically Erasable Programmable ROM)) capable of electrically erasing/programming data. In the present embodiment 7, too, as in the foregoing embodiment 4, the impurity concentration of the epitaxial layer 2E is made lower than that of the semiconductor substrate body 2S.

In the present embodiment 7, too, the semiconductor substrate 2 is formed thereover with a p-well 6p3 and an n-well 6n2. These p-well 6p3 and n-well 6n2 are formed, as in the foregoing embodiments 4 to 6, to extend from the surface of the epitaxial layer 2E to the upper portion of the semiconductor substrate body 2S. Moreover, their impurity concentrations are made gradually lower depthwise of the semiconductor region 2, as in the foregoing embodiment 4.

The memory cell region is formed with a memory cell MC1. This memory cell MC1 is constructed of a single MOS.FET. The memory cell MC1 is composed of: a pair of semiconductor regions 20a and 20b formed in the upper portion of the p-well 6p3; a gate insulating film 20c formed over the epitaxial layer 2E; a floating gate electrode 20d formed over the gate insulating film 20c; a control gate electrode 20e formed over the floating gate electrode 20d through the (not-shown) insulating film.

One semiconductor region 20a is composed of a semiconductor region 20a1 and a semiconductor region 20a2 formed in the former. The semiconductor region 20a1 is doped with an $n^-$-type impurity such as phosphor, and the semiconductor region 20a2 is doped with an $n^+$-type impurity such as As.

Moreover, the other semiconductor region 20b is composed of a semiconductor region 20b1 and a semiconductor region 20b2 formed in the former. The semiconductor region 20b1 is doped with a $p^+$-type impurity such as boron, and the semiconductor region 20b2 is doped with an $n^+$-type impurity such as As.

On the other hand, the peripheral circuit region is formed with the nMOS 4N and the pMOS 4P, for example. The nMOS 4N is composed of: the paired semiconductor regions 4Na and 4Nb formed in the upper portion of the p-well 6p3; the gate insulating film 4Nc formed over the epitaxial layer 2E; and the gate electrode 4Nd formed over the gate insulating film 4Nc. These semiconductor regions 4Na and 4Nb are doped with an n-type impurity such as phosphor.

The pMOS 4P is composed of: the paired semiconductor regions 4Pa and 4Pb formed in the upper portion of the n-well 6n2; the gate insulating film 4Pc formed over the epitaxial layer 2E; and the gate electrode 4Pd formed over the gate insulating film 4Pc. These semiconductor regions 4Pa and 4Pb are doped with a p-type impurity such as boron.

The semiconductor region 4Na of the nMOS 4N and the semiconductor region 4Pa of the pMOS 4P are electrically connected through the first-layer wiring line 10 to construct the CMOS circuit.

Thus in the present embodiment 7, the following effects can be achieved in addition to those of the foregoing embodiment 1.

Specifically, in the structure of the present embodiment 7, the memory cell of the flash memory (i.e., EEPROM) is formed over the epitaxial layer 2E having less defects such as the precipitation of oxygen, so that the breakdown voltage of the gate insulating film 20c can be raised to improve the data programming resistance. Moreover, the erasure dispersion at the time of erasing the data can be reduced. As a result, it is possible to improve the performance, reliability and production yield of the flash memory (i.e., EEPROM).

Although our invention has been specifically described in connection with its embodiments, it should not be limited to its foregoing embodiments 1 to 7 but can naturally be modified in various manners without departing the gist thereof.

For example, the foregoing embodiments 1 to 3 have been described in case the gettering layer is made of poly-silicon. However, the present invention should not be limited thereto but can be modified in various manners. For example, the gettering layer may be formed by the method of mechanically forming a working strain on the back of the semiconductor substrate body, the method of properly adjusting or precipitating the oxygen element which is present in the semiconductor substrate body, or the method of doping the semiconductor substrate with carbon ions. Alternatively, the structure may be dispensed with the gettering layer. In the method of properly adjusting or precipitating the oxygen element in the aforementioned semiconductor substrate body, the substrate gettering effect can be enhanced by setting the oxygen concentration to about or more than $9 \times 10^{17}$ atoms/cm$^3$. At the same time, the gate insulating film can be formed over the epitaxial layer formed over the semiconductor substrate body and containing no oxygen element, thereby to improve the breakdown characteristics of the gate insulating film. Specifically in the prior art for forming the gate insulating film directly over the principal surface of the semiconductor substrate body, if the oxygen concentration present in the semiconductor substrate body is made as high as $9 \times 10^{17}$ atoms/cm$^3$, the oxygen is precipitated in the aforementioned principal surface so that any clean gate insulating film is not formed to deteriorate the breakdown characteristics of the gate insulating film. In the prior art, therefore, the oxygen concentration has to be lowered to make the gettering effect insufficient.

Moreover, the foregoing embodiments 1 to 7 have been described in case the epitaxial layer is formed by the epitaxial growth method using the SiH$_4$ gas. However, the present invention should not be limited thereto but can be modified in various manners. For example, the epitaxial layer may be formed by the epitaxial growth method using silicon tetrachloride (SiCl$_4$) gas.

Moreover, the foregoing embodiments 1, 2 and 4 to 7 have been described in case the semiconductor substrate body and the epitaxial layer are made of p$^-$-type Si. However, the present invention should not be limited thereto but can be modified such that the semiconductor substrate body and the epitaxial layer are made of n$^-$-type Si. In the foregoing embodiment 3, moreover, the semiconductor substrate body and the epitaxial layer may be made of n$^-$-type Si, and the p$^+$-type semiconductor region may be made of n$^+$-type Si.

Moreover, the foregoing embodiment 3 has been described in case the p$^+$-type semiconductor region for suppressing the latchup is formed all over the semiconductor substrate body. However, the present invention should not be limited thereto but can be modified in various manners. For example, a p$^+$-type semiconductor region may be formed below the CMOS circuit forming region.

Figure 29:
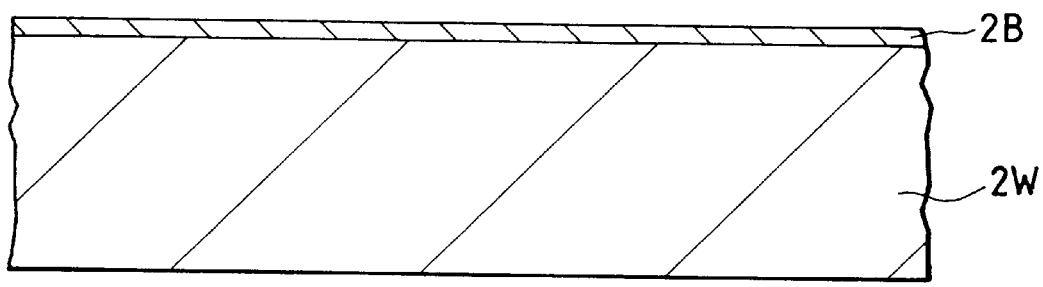
FIG. 29 is a section showing an essential portion at a step of manufacturing a semiconductor integrated circuit device according to another embodiment of the present invention.
Figure 30:
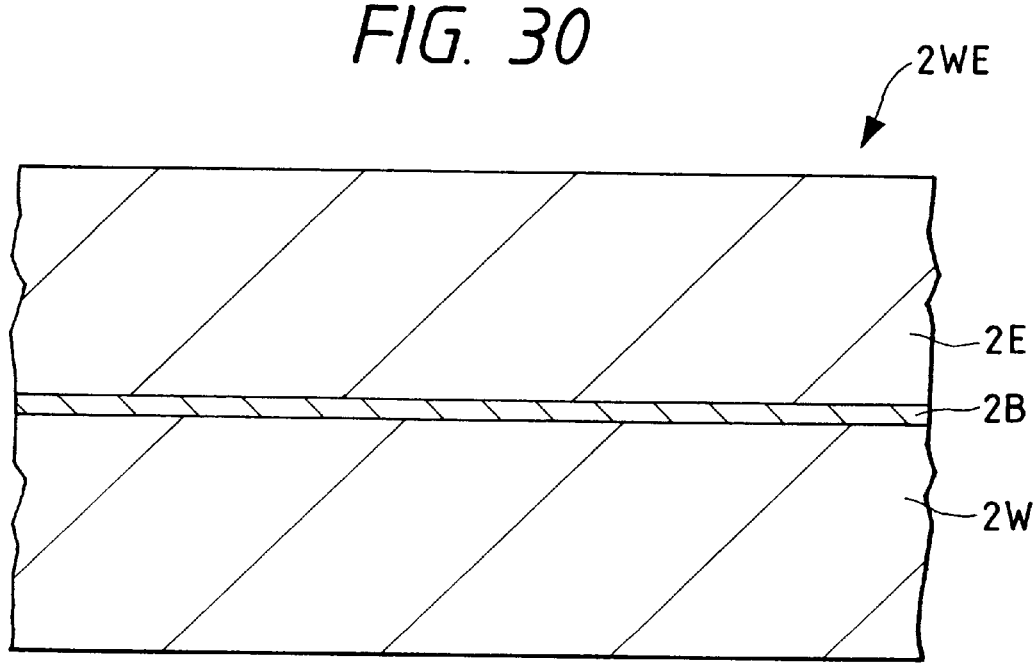
FIG. 30 is a section showing an essential portion at the step, as subsequent to FIG. 29, of manufacturing a semiconductor integrated circuit device according to another embodiment of the present invention.

Moreover, the foregoing embodiment 3 has been described in case the p$^+$-type semiconductor region is formed at a predetermined depth from the principal surface of the semiconductor substrate body. However, the present invention should not be limited thereto but may be modified such that the p$^+$-type semiconductor region 2B is formed over the principal surface of the semiconductor substrate body 2S, as shown in FIG. 29. Incidentally, FIG. 30 shows the case in which the epitaxial layer 2E is formed over the semiconductor substrate body 2S of FIG. 29.

In the semiconductor integrated circuit device having the structure described in the foregoing embodiment 3, moreover, the non-defective layer of the semiconductor integrated circuit device of the foregoing embodiment 2 may be formed below the epitaxial layer.

Moreover, the techniques having been described in connection with the foregoing embodiments 1 to 3 can also be applied to another semiconductor integrated circuit device such as the semiconductor integrated circuit device which has a semiconductor memory circuit such as the flash memory represented by the DRAM, the SRAM or the ROM (Read Only Memory).

Moreover, the techniques of the foregoing embodiments 1 to 7 can also be applied to the semiconductor integrated circuit device which has a logic circuit such as the so-called "microcomputer".

Moreover, the semiconductor substrate body 2S having a size as large as 12 inches may be useful.

In the description thus far made, our invention has been described in case it is applied to the semiconductor integrated circuit device having the CMOS circuit having the field of application of its background. However, the present invention should not be limited thereto but can be modified in various manners. For example, the present invention can be applied to another semiconductor integrated circuit device such as the semiconductor integrated circuit device having the bipolar transistors or the semiconductor integrated circuit device having a BiCMOS circuit composed of the bipolar transistors and the CMOS circuit. In the description thus far made, moreover, the MOS.FET is used, but the present invention should not be limited thereto. For example, the MIS.FET (i.e., Metal-Insulator-Semiconductor.FET), which has its cate insulating film formed of thermally oxidized SiO$_2$ and the silicon nitride film (SiN) formed over the SiO$_2$ may also be used.

The effects to be obtained by the representative of the invention disclosed herein will be briefly described in the following.

(1) According to the semiconductor wafer manufacturing process of the present invention, any semiconductor substrate body of high price and density need not be used so that the cost for the semiconductor wafer capable of realizing high element characteristics and reliability can be lowered.

(2) According to the semiconductor integrated circuit device manufacturing process of the present invention, a gate insulating film having an excellent film quality can be formed by forming the gate insulating film of a MOS.FET over a semiconductor single crystal layer so that the gate insulating film can have its breakdown voltage raised to reduce the defect density of the gate insulating film. Moreover, the semiconductor substrate body of high price and density need not be used, but the semiconductor single crystal layer can be thinned to reduce the cost for the semiconductor integrated circuit device having high element characteristics and reliability. As a result, it is possible to improve the performance, production yield and reliability of the semiconductor integrated circuit device and to lower the cost for the semiconductor integrated circuit device.

(3) According to the semiconductor integrated circuit device manufacturing process of the present invention, the degree of freedom for setting the impurity concentration and depth is so high when a semiconductor region such as a well is formed in the semiconductor substrate, as to facilitate the control of the formation. As a result, it is possible to reduce the defective products thereby to improve the production yield. Moreover, the cost for the semiconductor integrated circuit device can be lowered.

(4) According to the semiconductor integrated circuit device manufacturing process of the present invention, the impurity concentration of the semiconductor substrate body is made higher than that of the semiconductor single crystal layer, so that the resistance of the semiconductor substrate body can be relatively lowered to improve the resistance to the latchup. As a result, it is possible to further improve the performance, production yield and reliability of the semiconductor integrated circuit device.

(5) According to the semiconductor integrated circuit device manufacturing process of the present invention, since the first semiconductor region is formed by the ion implantation method and the thermal diffusion method, the semiconductor integrated circuit device can be manufactured without being accompanied by any change in the design or manufacture process but by using the same method as that of the semiconductor integrated circuit device having the so-called "mirror wafer", when it is to be manufactured by using the semiconductor wafer having the semiconductor single crystal layer over the semiconductor substrate body.

(6) According to the semiconductor integrated circuit device manufacturing process of the present invention, since the memory cell of the dynamic type random access memory is formed over the semiconductor single crystal layer having less defects such as the precipitation of oxygen, it is possible to reduce the junction leakage current in the source region and the drain region of the transfer MOS.FET of the memory cell. Since, moreover, the charge leakage in the capacitor of the memory cell can be suppressed to elongate the charge storage time period, it is possible to improve the refresh characteristics. As a result, it is possible to improve the performance, reliability and production yield of the dynamic type random access memory.

(7) According to the semiconductor integrated circuit device manufacturing process of the present invention, since the memory cell of the static type random access memory is formed over the semiconductor single crystal layer having less defects such as the precipitation of oxygen, the junction leakage current of the source region and drain region of the MOS.FET composing the memory cell can be reduced to improve the data storage retaining characteristics (e.g., the data retention level) thereby to reduce the data retention fault percentage. As a result, it is possible to improve the performance, reliability and production yield of the static type random access memory.

(8) According to the semiconductor integrated circuit device manufacturing process of the present invention, the memory cell of a read only memory capable of electrically erasing and programming data is formed over the semiconductor single crystal layer having less defects such as the precipitation of oxygen, so that the resistance to the data programming can be improved. Moreover, the dispersion of the data erasure can be reduced. As a result, it is possible to improve the performance, reliability and production yield of the read only memory capable of electrically erasing and programming the data.

What is claimed is:

1. A method of manufacturing a semiconductor integrated circuit device, comprising steps of:

providing a semiconductor substrate having a first conductivity type and having a first impurity concentration at a whole of a principal surface of said semiconductor substrate;

forming an epitaxial layer of said first conductivity type on said principal surface;

forming a well region of said first conductivity type in said epitaxial layer by introducing an impurity in said epitaxial layer through a surface of said epitaxial layer;

forming a gate oxide film on a surface of said epitaxial layer;

forming a floating gate electrode on said gate oxide film on said well region; and forming a control gate electrode over said floating gate electrode, wherein an impurity concentration of said well region is greater than both an impurity concentration of said epitaxial layer and said first impurity concentration.

2. A method of manufacturing a semiconductor integrated circuit device according to claim 1, wherein said epitaxial layer has substantially a same impurity concentration as a designed impurity concentration of said first impurity concentration.

3. A method of manufacturing a semiconductor integrated circuit device according to claim 2, wherein said semiconductor substrate is a relatively lightly doped semiconductor substrate.

4. A method of manufacturing a semiconductor integrated circuit device according to claim 1, wherein an impurity concentration of said semiconductor substrate is about $10^{15}$ atoms/cm$^3$.

5. A method of manufacturing a semiconductor integrated circuit device according to claim 4, wherein a thickness of said epitaxial layer is within a range of 0.3 µm to 5 µm.

6. A method of manufacturing a semiconductor integrated circuit device according to claim 1, wherein a thickness of said epitaxial layer is within a range of 0.3 µm to 5 µm.

7. A method of manufacturing a semiconductor integrated circuit device according to claim 6, wherein said well region extends into said semiconductor substrate, such that an impurity concentration of said well region gradually decreases from said epitaxial layer into said semiconductor substrate through an interface portion therebetween.

8. A method of manufacturing a semiconductor integrated circuit device according to claim 5, wherein said well region extends into said semiconductor substrate, such that an impurity concentration of said well region gradually decreases from said epitaxial layer into said semiconductor substrate through an interface portion therebetween.

9. A method of manufacturing a semiconductor integrated circuit device, comprising steps of:

forming an epitaxial layer of a first conductivity type on a semiconductor substrate having said first conductivity type and having a first impurity concentration at a whole of said principal surface of said semiconductor substrate, such that said epitaxial layer is formed on said principal surface of said first impurity concentration, wherein a thickness of said epitaxial layer is within a range of 0.3 μm to 5 μm;

forming a well region in said epitaxial layer by introducing an impurity in said epitaxial layer through a surface of said epitaxial layer;

forming a gate oxide film of a MISFET on a surface of said epitaxial layer;

forming a floating gate electrode of said MISFET on said gate oxide film on said well region; and forming a control gate electrode of said MISFET over said floating gate electrode, wherein said first impurity concentration is lower than an impurity concentration of a portion of said well region where a channel region of said MISFET is formed.

10. A method of manufacturing a semiconductor integrated circuit device according to claim 9, wherein said epitaxial layer has substantially a same impurity concentration as a designed impurity concentration of said first impurity concentration.

11. A method of manufacturing a semiconductor integrated circuit device according to claim 9, wherein a memory cell of an EEPROM comprises said MISFET.

12. A method of manufacturing a semiconductor integrated circuit device including a memory cell having a floating gate electrode and a control gate electrode, comprising steps of:

providing a semiconductor substrate having a first conductivity type and having a first impurity concentration at a whole of a principal surface of said substrate;

forming an epitaxial layer of said first conductivity type on said principal surface such that said epitaxial layer has a thickness within a range of $0.3\mu$ to $5\mu$;

forming a well region of said first conductivity type in said epitaxial layer by introducing an impurity in said epitaxial layer through a surface of said epitaxial layer such that an impurity concentration of said well region is greater than both an impurity concentration of said epitaxial layer and said first impurity concentration;

forming a gate oxide film of said memory cell on a surface of said epitaxial layer by oxidation of said surface of said epitaxial layer; and forming a floating gate electrode of said memory cell on said gate oxide film on said well region.

13. A method of manufacturing a semiconductor integrated circuit device according to claim 12, wherein said semiconductor substrate provided includes a gettering layer formed on a back surface of a semiconductor substrate body.

14. A method of manufacturing a semiconductor integrated circuit device including an MISFET, of a memory cell, having a floating gate electrode and a control gate electrode, comprising steps of:

providing a semiconductor substrate having a first conductivity type and having a first impurity concentration at a whole of a principal surface of said substrate;

forming an epitaxial layer of said first conductivity type on said principal surface such that said epitaxial layer has a thickness within a range of $0.3\mu$ to $5\mu$;

forming a well region of said first conductivity type in said epitaxial layer by introducing an impurity in said epitaxial layer through a surface of said epitaxial layer such that said first impurity concentration is lower than an impurity concentration of a portion of said well region where a channel region of said MISFET is to be formed;

forming a gate oxide film of said memory cell on a surface of said epitaxial layer by oxidation of said surface of said epitaxial layer; and forming a floating gate electrode of said memory cell on said gate oxide film on said well region.

15. A method of manufacturing a semiconductor integrated circuit device according to claim 14, wherein said semiconductor substrate provided includes a gettering layer formed on a back surface of a semiconductor substrate body.

16. A method of manufacturing a semiconductor integrated circuit device according to claim 9, wherein said semiconductor substrate provided includes a gettering layer formed on a back surface of a semiconductor substrate body.

17. A method of manufacturing a semiconductor integrated circuit device according to claim 1, wherein said semiconductor substrate provided includes a gettering layer formed on a back surface of a semiconductor substrate body.

* * * * *